United States Patent
Saitoh

(10) Patent No.: US 9,548,085 B2
(45) Date of Patent: Jan. 17, 2017

(54) SEMICONDUCTOR MEMORY DEVICE

(71) Applicant: KABUSHIKI KAISHA TOSHIBA, Minato-ku (JP)

(72) Inventor: Masumi Saitoh, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/942,348

(22) Filed: Nov. 16, 2015

(65) Prior Publication Data

US 2016/0141003 A1    May 19, 2016

(30) Foreign Application Priority Data

Nov. 19, 2014 (JP) ................................. 2014-234339

(51) Int. Cl.
| | | |
|---|---|---|
| G11C 5/06 | (2006.01) | |
| G11C 5/14 | (2006.01) | |
| H01L 45/00 | (2006.01) | |
| H01L 27/24 | (2006.01) | |

(52) U.S. Cl.
CPC ............. *G11C 5/145* (2013.01); *H01L 27/249* (2013.01); *H01L 27/2454* (2013.01); *H01L 45/04* (2013.01); *H01L 45/1226* (2013.01)

(58) Field of Classification Search
CPC ...... G11C 5/145; H01L 45/04; H01L 45/1226; H01L 27/2454
USPC ........................................ 365/51, 63, 189.08
See application file for complete search history.

(56) References Cited

U.S. PATENT DOCUMENTS

| | | | |
|---|---|---|---|
| 8,391,052 B2 | 3/2013 | Kono | |
| 8,493,800 B2 | 7/2013 | Terada et al. | |
| 8,503,255 B2 | 8/2013 | Sasaki | |
| 2002/0070402 A1* | 6/2002 | Ichige | H01L 27/0805 257/296 |
| 2010/0195392 A1 | 8/2010 | Freeman | |
| 2010/0238603 A1* | 9/2010 | Chung | H01G 4/228 361/301.4 |
| 2010/0246092 A1* | 9/2010 | Shibue | H01G 4/232 361/313 |

(Continued)

FOREIGN PATENT DOCUMENTS

| | | |
|---|---|---|
| JP | 2002-299586 A | 10/2002 |
| JP | 2009-53639 A | 3/2009 |

(Continued)

*Primary Examiner* — Viet Q Nguyen
(74) *Attorney, Agent, or Firm* — Oblon, McClelland, Maier & Neustadt, L.L.P.

(57) ABSTRACT

According to one embodiment, a semiconductor memory device includes a semiconductor substrate, a memory cell array disposed on the semiconductor substrate, a capacitor and a control circuit. The memory cell array includes a plurality of memory cells. The control circuit supplies a voltage to the memory cell array. The memory cell array includes a first conductive body disposed in a first region on the semiconductor substrate. The first conductive body extends in a first direction intersecting with a surface of the substrate. The capacitor includes first and second electrodes disposed in a second region different from the first region on the semiconductor substrate. The electrodes each include a second conductive body extending in the first direction. The first conductive body and the second conductive body include an identical material.

20 Claims, 14 Drawing Sheets

(56) References Cited

U.S. PATENT DOCUMENTS

| | | | |
|---|---|---|---|
| 2011/0012188 A1* | 1/2011 | Kito | H01L 27/11578 257/324 |
| 2013/0051126 A1* | 2/2013 | Kwong | H01G 4/30 365/149 |
| 2014/0284535 A1 | 9/2014 | Saitoh et al. | |

FOREIGN PATENT DOCUMENTS

| | | |
|---|---|---|
| JP | 2011-165240 A | 8/2011 |
| JP | 2011-175710 A | 9/2011 |
| JP | 2011-253596 A | 12/2011 |

\* cited by examiner

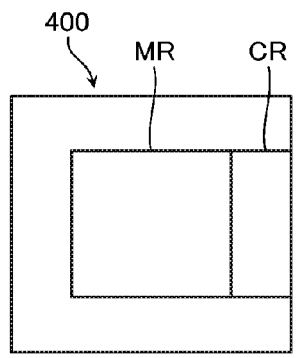
FIG. 6A
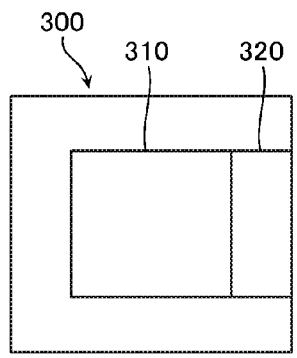
FIG. 6B
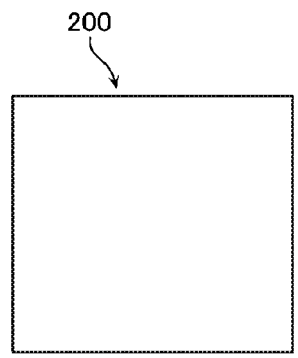
FIG. 6C
FIG. 7
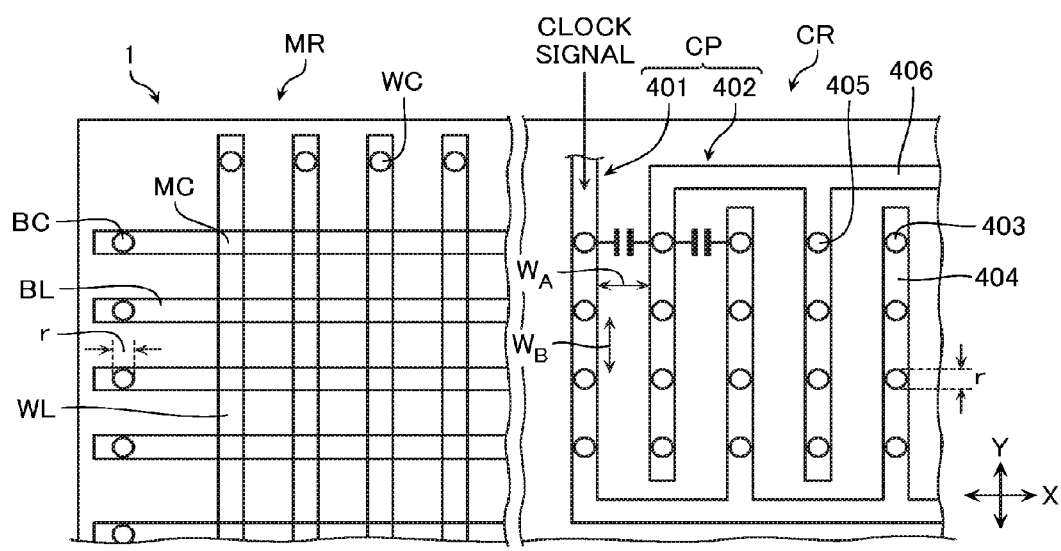

SEMICONDUCTOR MEMORY DEVICE

CROSS REFERENCE TO RELATED APPLICATIONS

This application is based on and claims the benefit of priority from prior Japanese Patent Application No. 2014-234339, filed on Nov. 19, 2014, the entire contents of which are incorporated herein by reference.

FIELD

Embodiments described herein relate generally to a semiconductor memory device.

BACKGROUND

Recently, semiconductor memory devices such as a Resistive Random Access Memory (ReRAM), a NAND flash memory, and a Dynamic Random Access Memory (DRAM) have been highly integrated. In addition to memory cell portions storing data, such semiconductor memory device includes control circuits to control memory cells. Here, an increase in memory cell layers in the memory cell portions also increases the area of the control circuits.

BRIEF DESCRIPTION OF THE DRAWINGS

FIGS. 6A to 6C are schematic plan views illustrating the exemplary constitution;

FIG. 7 is an enlarged view of a part of FIG. 6A;

DETAILED DESCRIPTION

A semiconductor memory device according to one embodiment includes a semiconductor substrate, a memory cell array, a capacitor and a control circuit. The memory cell array is disposed on the semiconductor substrate. The memory cell array includes a plurality of memory cells. The control circuit supplies a voltage to the memory cell array. The memory cell array includes a first conductive body disposed in a first region on the semiconductor substrate. The first conductive body extends in a first direction intersecting with a surface of the substrate. The capacitor includes first and second electrodes disposed in a second region different from the first region on the semiconductor substrate. The first and second electrodes each comprise a second conductive body extending in the first direction. The first conductive body and the second conductive body include an identical material.

First Embodiment

Figure 1:
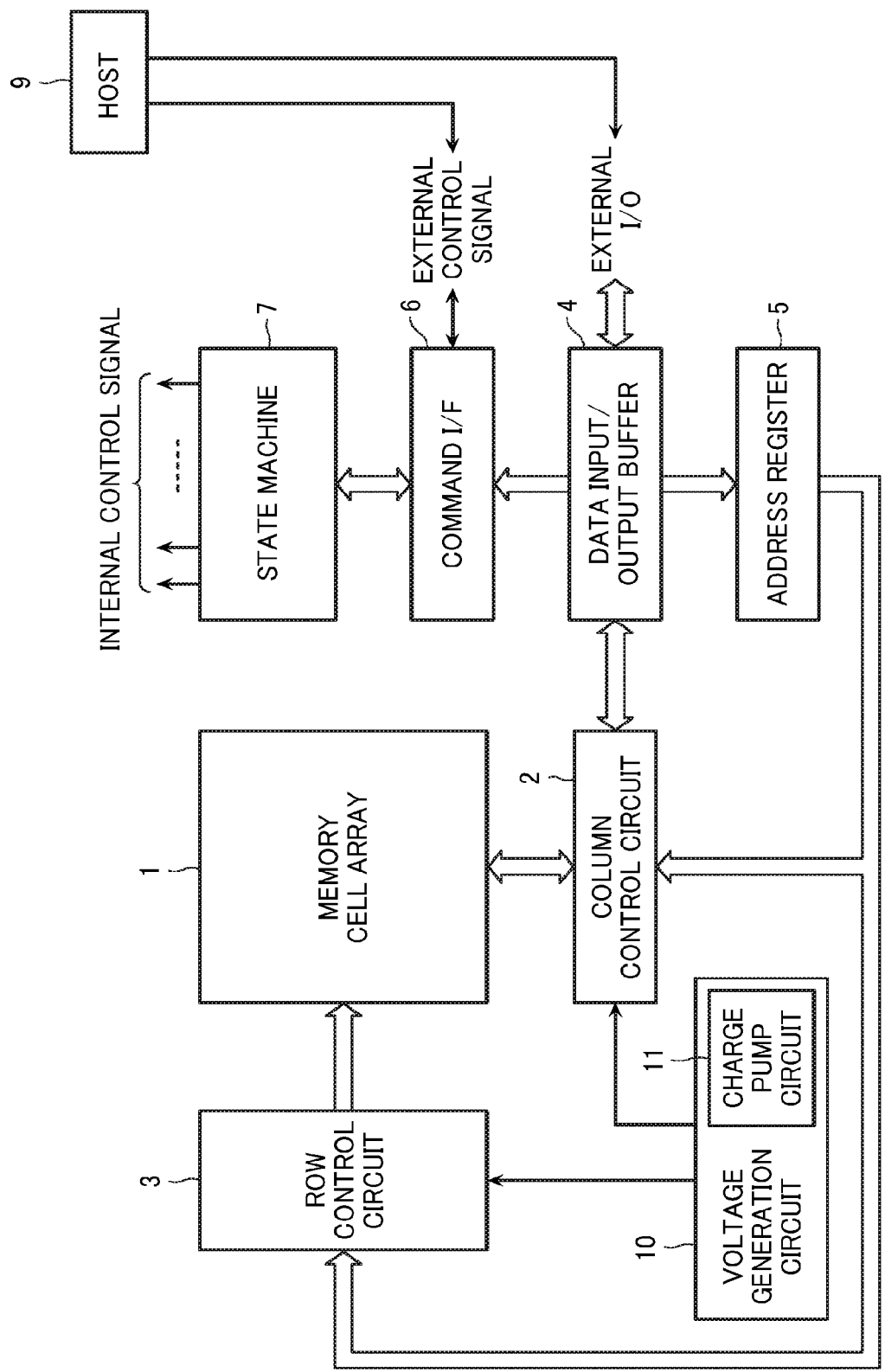
FIG. 1 is an exemplary block diagram of a semiconductor memory device according to a first embodiment.

FIG. 1 is a block diagram of a non-volatile semiconductor memory device according to the first embodiment. This non-volatile semiconductor memory device includes a plurality of memory cells MC and the memory cell array 1. The memory cells MC are disposed in a matrix. The memory cell array 1 includes bit lines BL and word lines WL connected to these memory cells MC and are disposed so as to be orthogonal to one another. Around this memory cell array 1, a column control circuit 2 and a row control circuit 3 are disposed. The column control circuit 2 controls the bit lines BL to erase data in the memory cells, write data to the memory cells, and read data from the memory cells. The row control circuit 3 selects the word line WL to apply a voltage to erase data in the memory cells, write data to the memory cells, and read data from the memory cells.

A data input/output buffer 4 is connected to an external host 9 via an I/O line. The data input/output buffer 4 receives writing data, receives a erasure instruction, outputs reading data, and receives address data and command data. The data input/output buffer 4 transmits the received writing data to the column control circuit 2. The data input/output buffer 4 receives the data read from the column control circuit 2 and outputs the data to the outside. The address supplied from the outside to the data input/output buffer 4 is transmitted to the column control circuit 2 and the row control circuit 3 via an address register 5.

The command supplied from the host 9 to the data input/output buffer 4 is transmitted to a command interface 6. The command interface 6 receives an external control signal from the host 9. The command interface 6 determines whether the data input to the data input/output buffer 4 is the writing data, the command, or the address. If the input data is the command, the command interface 6 transfers the command as a receiving command signal to a state machine 7.

The state machine 7 manages this entire non-volatile semiconductor memory device. The state machine 7 accepts the command from the host 9 via the command interface 6 to manage, for example, reading, writing, erasing, and inputting/outputting of the data.

The external host 9 also can receive status information managed by the state machine 7 and determine the operation result. This status information is also used to control the writing and the erasure.

The state machine 7 controls a voltage generation circuit 10. This control allows the voltage generation circuit 10 to output pulses at any given voltage and at any given timing. The voltage generation circuit 10 includes a charge pump circuit 11. The charge pump circuit 11 steps up an input voltage such as a power supply voltage to output a voltage greater than the input voltage.

Here, the formed pulses can be transferred to any given wiring selected by the column control circuit 2 and the row control circuit 3. These column control circuit 2, row control circuit 3, state machine 7, voltage generation circuit 10, or a similar component configure the control circuits in the embodiment.

Figure 2:
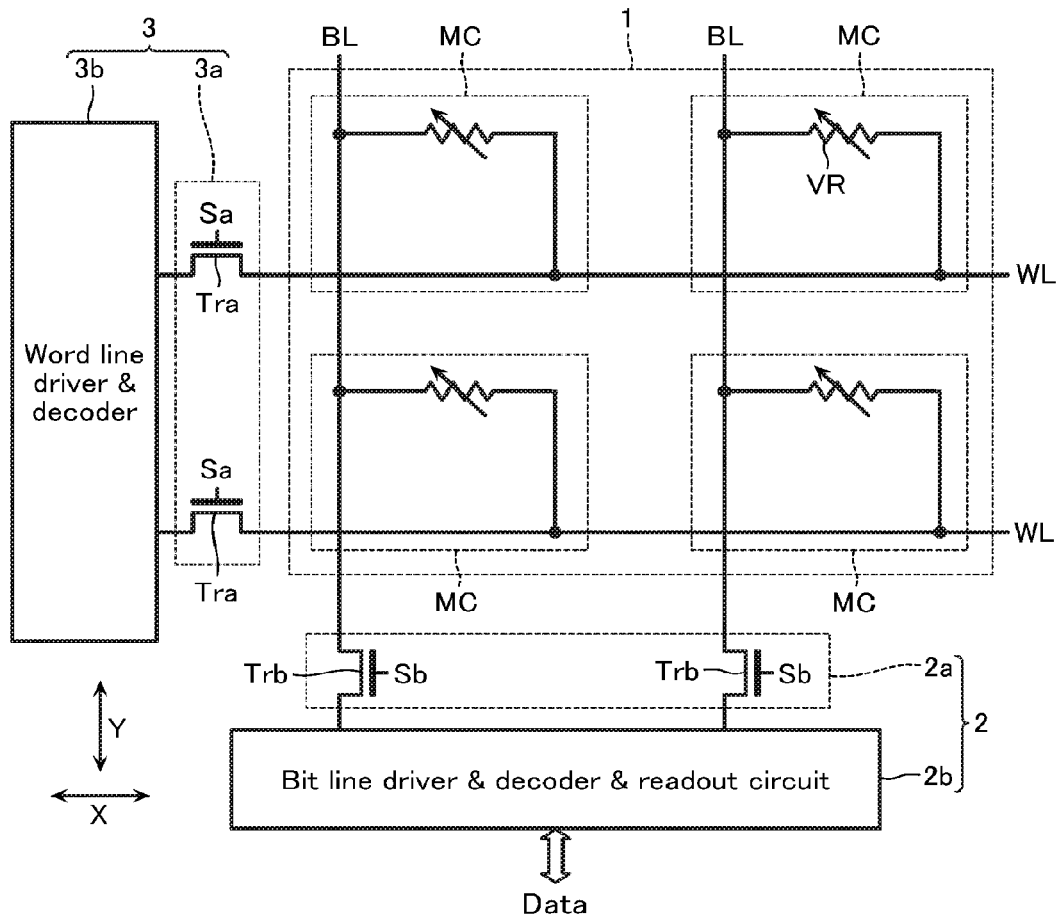
FIG. 2 is an exemplary circuit diagram of a memory cell array 1 of the semiconductor memory device.

The following describes the circuit configuration of the memory cell array 1 according to the embodiment with reference to FIG. 2. FIG. 2 is a circuit diagram illustrating the configuration of the memory cell array 1 according to the embodiment.

As illustrated in FIG. 2, the memory cell array 1 includes the word lines WL and the bit lines BL intersecting with one another, and the memory cells MC. The memory cells MC are disposed at intersecting portions of the word lines WL and the bit lines BL. The word lines WL are disposed at predetermined pitches in the Y direction and extend in the X direction. The bit lines BL are disposed at predetermined pitches in the X direction and extend in the Y direction. That is, the memory cells MC are disposed on a surface formed in the X direction and the Y direction in a matrix.

As illustrated in FIG. 2, the memory cell MC includes a variable resistive element VR. The resistance value of the variable resistive element VR is electrically rewritable. The memory cell MC stores data in a non-volatile manner based on the resistance value. The other end of the variable resistive element VR is connected to the bit line BL.

As illustrated in FIG. 2, the column control circuit 2 includes a bit line selection circuit 2a and a bit line driving circuit 2b. The bit line selection circuit 2a selects the bit line BL. The bit line driving circuit 2b drives the bit line BL.

As illustrated in FIG. 2, the bit line selection circuit 2a includes a plurality of selection transistors Trb. One end of the selection transistor Trb is connected to one end of the bit line BL, and the other end is connected to the bit line driving circuit 2b. A signal Sb is supplied to the gate of the selection transistor Trb. That is, the bit line selection circuit 2a selectively connects the bit line BL to the bit line driving circuit 2b according to the signal Sb.

As illustrated in FIG. 2, the bit line driving circuit 2b applies a voltage required to erase the data in the memory cell MC, write the data to the memory cell MC, and read the data from the memory cell MC to the bit line BL. The bit line driving circuit 2b outputs the data read from the bit line BL to the outside.

The row control circuit 3 includes a word line selection circuit 3a and a word line driving circuit 3b. The word line selection circuit 3a selects the word line WL. The word line driving circuit 3b drives the word line WL.

As illustrated in FIG. 2, the word line selection circuit 3a includes a plurality of selection transistors Tra. One end of the selection transistor Tra is connected to one end of the word line WL, and the other end is connected to the word line driving circuit 3b. A signal Sa is supplied to the gate of the selection transistor Tra. That is, the word line selection circuit 3a selectively connects the word line WL to the word line driving circuit 3b by controlling the signal Sa.

The word line driving circuit 3b applies a voltage required to erase the data in the memory cell MC, write the data to the memory cell MC, and read the data from the memory cell MC to the word line WL.

Figure 3:
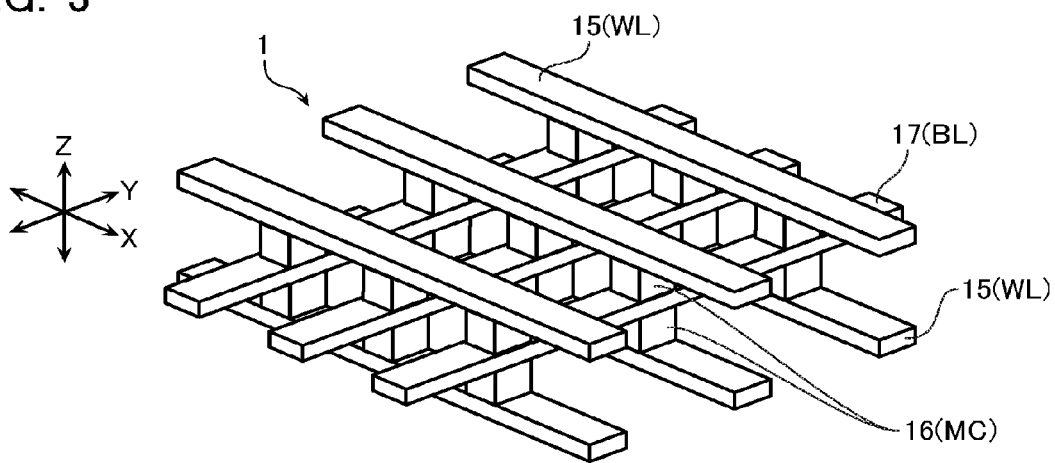
FIG. 3 is a schematic perspective view for describing the memory cell array 1.

The following describes the laminated structure of the memory cell array 1 according to the first embodiment with reference to FIG. 3. FIG. 3 is a schematic perspective view for describing the laminated structure of the memory cell array 1 according to the first embodiment. The memory cell array 1 includes first conducting layers 15, memory layers 16, second conducting layers 17, the memory layers 16, and the first conducting layers 15 from the lower layer to the upper layer. That is, the two memory layers 16 positioned vertically share the one second conducting layer 17. However, the second conducting layer 17 may be in contact with only the one memory layer 16 positioned on or under the second conducting layer 17. The first conducting layer 15 functions as the word line WL. The memory layer 16 functions as the memory cell MC. The second conducting layer 17 functions as the bit line BL.

As illustrated in FIG. 3, the first conducting layers 15 are formed into a stripe shape extending in the X direction at predetermined pitches in the Y direction. The first conducting layer 15 is preferable to be heat-resistant and made of a material of low resistance value. For example, the first conducting layer 15 is constituted of tungsten (W), titanium (Ti), tantalum (Ta), and a nitride of these materials, or a laminated structure of these materials.

As illustrated in FIG. 3, the memory layers 16 are disposed between the first conducting layer 15 and the second conducting layer 17. The memory layers 16 are disposed in a matrix in the X direction and the Y direction.

As illustrated in FIG. 3, the second conducting layers 17 are formed into the stripe shape extending in the Y direction at predetermined pitches in the X direction. The second conducting layer 17 is in contact with the top surfaces of the memory layers 16. The second conducting layer 17 is preferable to be heat-resistant and made of a material of low resistance value. For example, the second conducting layer 17 is constituted of tungsten (W), titanium (Ti), tantalum (Ta), and a nitride of these materials, or a laminated structure of these materials.

Figure 4:
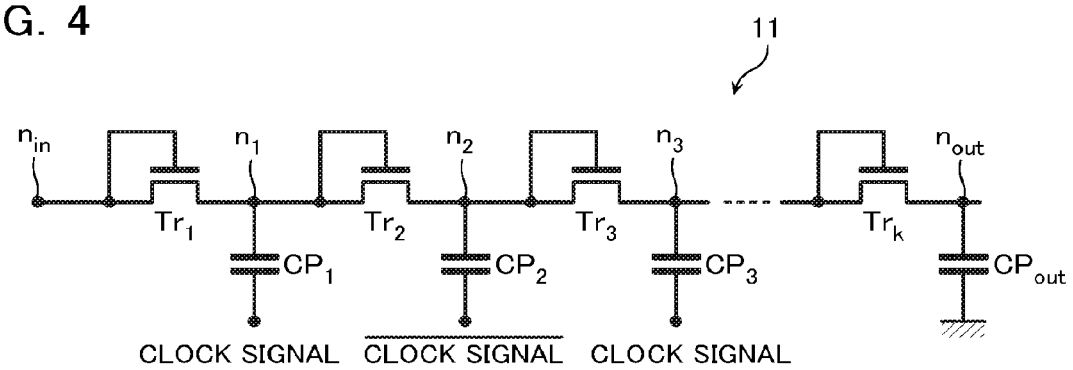
FIG. 4 is a circuit diagram for describing a part of a constitution of a charge pump circuit 11.

Next, with reference to FIG. 4, the following describes the constitution of the charge pump circuit 11 according to the embodiment. FIG. 4 is a circuit diagram for describing a part of the constitution of the charge pump circuit 11.

As illustrated in FIG. 4, the charge pump circuit 11 includes a plurality of field-effect transistors $Tr_1$ to $Tr_k$ (k is a positive integer) and a plurality of capacitors CP. The field-effect transistors $Tr_1$ to $Tr_k$ are connected in series between an input terminal $n_{in}$ and an output terminal $n_{out}$. One end of the capacitor CP is connected between adjacent two field-effect transistors Tr. Between the output terminal $n_{out}$ and a grounding terminal, a capacitor $CP_{out}$ is connected.

As illustrated in FIG. 4, the adjacent field-effect transistors Tr are connected at a source terminal and a drain terminal. Gate terminals of the plurality of field-effect transistors $Tr_1$ to $Tr_k$ are each connected to the drain terminals, operating as rectifying devices. Therefore, for example, instead of the plurality of field-effect transistors, other nonlinear devices, such as diodes, can also be used.

As illustrated in FIG. 4, the one end of the capacitor CP is connected to a node n, which is disposed between the adjacent two field-effect transistors Tr. A signal is input to the other end of the capacitor CP. As illustrated in FIG. 4, a clock signal is input to the predetermined capacitor CP. An inverted clock signal is input to the capacitor CP adjacent to this predetermined capacitor CP.

The following describes the operation of the charge pump circuit 11. For example, at a certain predetermined timing, a signal in an L state is input to a capacitor $CP_1$. In this case, a node $n_1$ connected to the capacitor $CP_1$ charges to negative. Therefore, via the field-effect transistor $Tr_1$, a current flows from the input terminal $n_{in}$ to the node $n_1$. This increases an amount of electric charge accumulated in the node $n_1$ and the capacitor $CP_1$.

Next, a signal in an H state is input to the capacitor $CP_1$. The signal in the L state is input to a capacitor $CP_2$. In this case, the node $n_1$ connected to the capacitor $CP_1$ charges to positive. A node $n_2$ connected to the capacitor $CP_2$ charges to negative. Therefore, via a field-effect transistor $Tr_2$, a current flows from the node $n_1$ to the node $n_2$. This increases the amount of electric charge accumulated in the node $n_2$ and the capacitor $CP_2$.

Subsequently, the clock signal and the inverted clock signal are appropriately input to the capacitors CP similarly. This gradually accumulates the electric charge in the capacitor $CP_{out}$, increasing an electric potential of the output terminal $n_{out}$. The electric potential of the output terminal $n_{out}$ is controlled up to the electric potential required for the writing operation, the erasure operation, or a similar operation. The electric potential is applied to the memory cell array 1 via the column control circuit 2, the row control circuit 3, or a similar circuit.

Figure 5A:
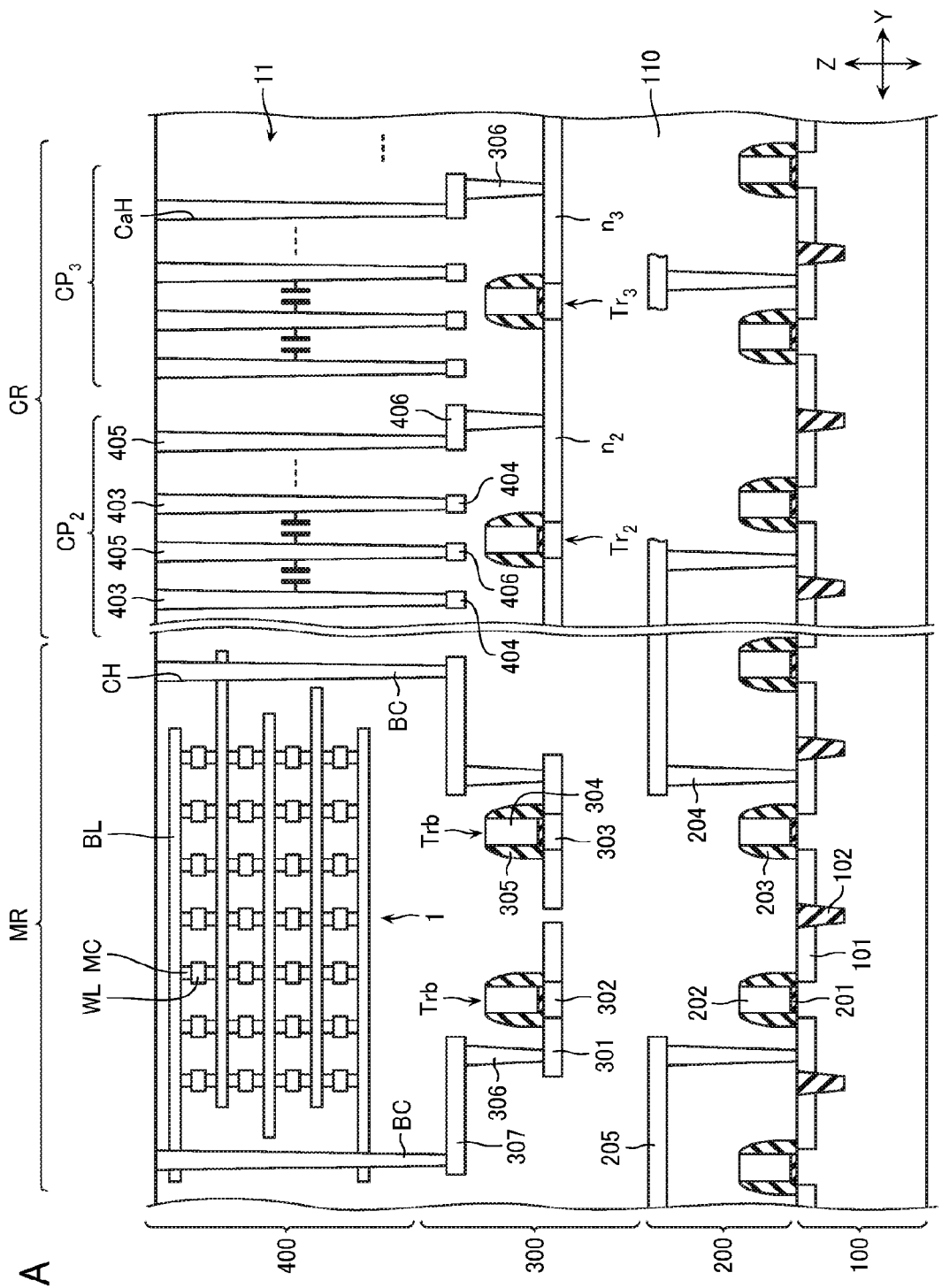
FIG. 5A is a schematic cross-sectional view illustrating an exemplary constitution of the semiconductor memory device according to the embodiment.

Next, with reference to FIG. 5A to FIG. 7, the following describes the constitution of the non-volatile semiconductor memory device according to the embodiment in further detail. FIG. 5A is a schematic cross-sectional view illustrating an exemplary constitution of the non-volatile semiconductor memory device according to the embodiment. FIG. 5B is a schematic cross-sectional view illustrating another exemplary constitution of the non-volatile semiconductor memory device.

Figure 5B:
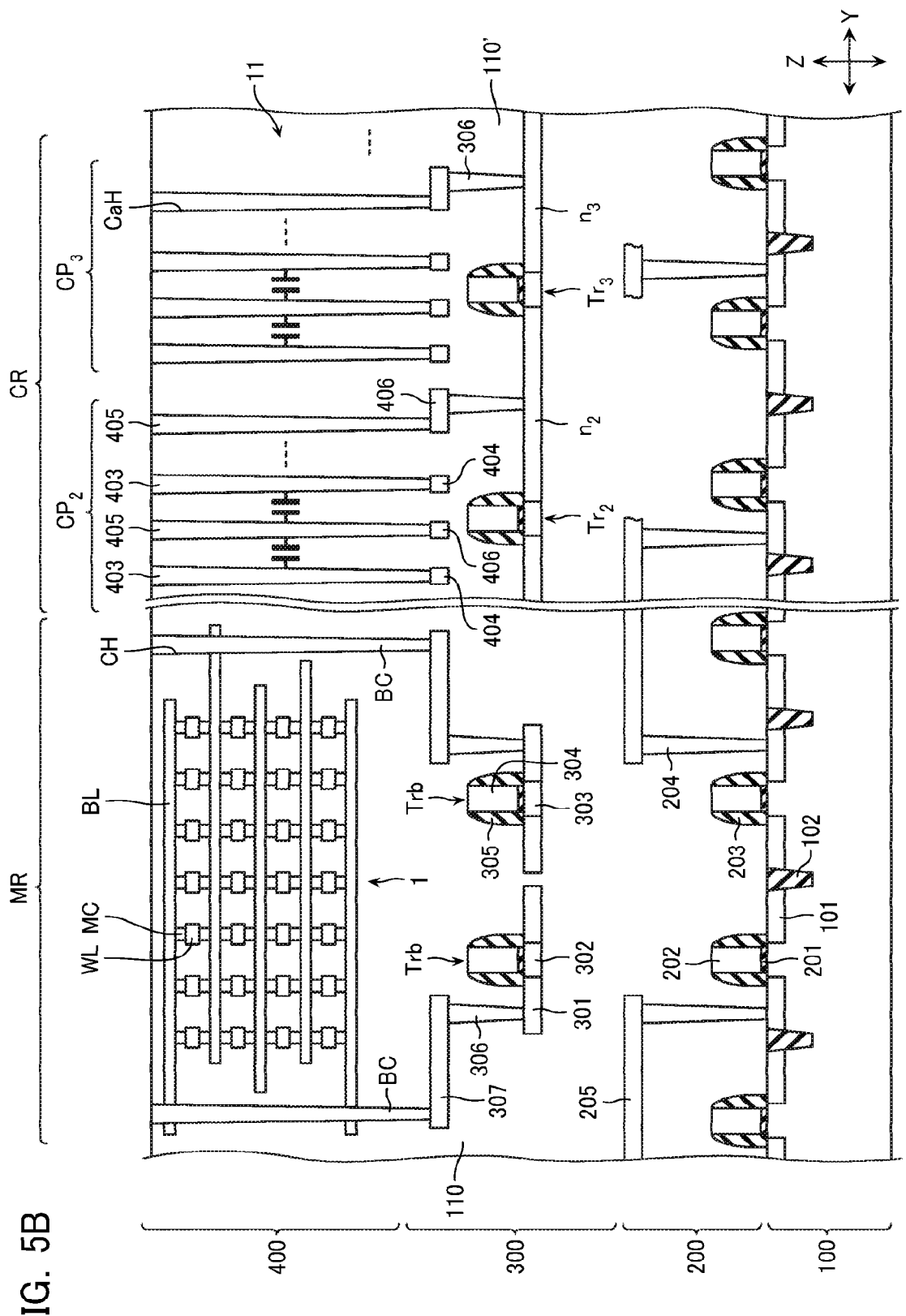
FIG. 5B is a schematic cross-sectional view illustrating another exemplary constitution of the semiconductor memory device.

As illustrated in FIG. 5A, the non-volatile semiconductor memory device according to the embodiment is formed by laminating a semiconductor substrate 100, a first transistor layer 200, a second transistor layer 300, and a memory cell array layer 400 in this order. At the first transistor layer 200, a plurality of field-effect transistors and a plurality of wirings are formed. The field-effect transistors use bulk silicon of the semiconductor substrate 100 as channels. The plurality of field-effect transistors constitute a CMOS circuit. At the second transistor layer 300, a plurality of field-effect transistors and a plurality of wirings are formed. The field-effect transistors use polycrystalline silicon as channels. Further, at the memory cell array layer 400, the memory cell array 1 and the plurality of capacitors CP extending in the laminating direction are formed. These plurality of wirings, field-effect transistors, and capacitors CP constitute the charge pump circuit 11 and other control circuits. The constitutions formed at the respective layers are embedded with an interlayer insulating layer 110. The interlayer insulating layer 110 is possibly made of, for example, silicon oxide and silicon nitride. As illustrated in FIG. 5B, only a part of an interlayer insulating layer 110' is possibly made of a different material.

As illustrated in FIG. 5A, a plurality of doped regions 101 are formed on the top surface of the semiconductor substrate 100. The doped region 101 operates as the source or the drain of the field-effect transistor. Apart sandwiched between the adjacent doped regions 101 of the semiconductor substrate 100 operates as a channel of the field-effect transistor. The doped regions 101 are each electrically diced by an insulating layer 102, operating as an electrode of another field-effect transistor.

As illustrated in FIG. 5A, in the first transistor layer 200, a gate insulating layer 201 and a gate electrode layer 202 are formed at a part between the adjacent doped regions 101 on the top surface of the semiconductor substrate 100. Insulating layers 203 are formed at the sidewalls of the gate insulating layer 201 and the gate electrode layer 202. The gate insulating layer 201 and the gate electrode layer 202 constitute the field-effect transistor together with the doped region 101. The doped region 101 is connected to a wiring layer 205 via a wiring 204 extending in the laminating direction (the Z direction). The wiring layer 205 is formed parallel to the semiconductor substrate 100.

As illustrated in FIG. 5A, the second transistor layer 300 includes semiconductor layers 302. The semiconductor layer 302 functions as the channel of the field-effect transistor. Doped regions 301 are disposed at both ends of the semiconductor layer 302. The doped regions 301 each function as the drain and the source of the field-effect transistor. On the semiconductor layer 302, a gate insulating layer 303 and a gate electrode layer 304 are formed. Insulating layers 305 are formed at the sidewalls of the gate insulating layer 303 and the gate electrode layer 304. The doped region 301 is connected to a wiring layer 307 via a wiring 306 extending in the laminating direction (the Z direction). The wiring layer 307 is formed parallel to the semiconductor substrate 100.

In the example illustrated in FIG. 5A, among the plurality of field-effect transistors disposed in the second transistor layer 300, the field-effect transistors disposed immediately below the memory cell array 1 are used as the selection transistors Tra and Trb, which are described with reference to FIG. 2. The selection transistors Tra and Trb constitute the bit line selection circuit 2a and the word line selection circuit 3a. In the example illustrated in FIG. 5A, among the plurality of field-effect transistors disposed in the second transistor layer 300, the field-effect transistors disposed immediately below the capacitors CP are used as the field-effect transistors $Tr_1$ to $Tr_k$, which are described with reference to FIG. 4. The field-effect transistors $Tr_1$ to $Tr_k$ constitute the charge pump circuit 11.

As illustrated in FIG. 5A, the memory cell array 1 is formed in the memory cell array layer 400. The bit line BL of the memory cell array 1 is connected to the selection transistor Trb via a bit line contact (a first conductive body, a third wiring) BC extending in the laminating direction (the Z direction). Although the illustration is omitted, the word line WL of the memory cell array 1 is similarly connected to the selection transistor Tra (not illustrated in FIG. 5A) via a word line contact (the first conductive body, the third wiring) WC extending in the laminating direction.

With the embodiment, the thickness of one layer of the memory cell array 1 is approximately 3 nm to 100 nm. With the embodiment, the lengths of the bit line contact BC and the word line contact WC in the laminating direction are approximately equal to the length of multiplying this thickness of one layer by the count of layers of the memory cell.

As illustrated in FIG. 5A, the memory cell array layer 400 includes the plurality of capacitors CP. The capacitors CP each include second conductive bodies 403 and 405 extending in the laminating direction (the Z direction). As will be described later with reference to FIG. 7, the second conductive bodies 403 and 405, which constitute the one capacitor CP, are disposed in alternation in the Y direction. The second conductive bodies 403 and 405 are each connected in common via connecting wirings 404 and 406.

FIG. 6A to 6C are schematic plan views illustrating the exemplary constitution. FIG. 6A illustrates the memory cell array layer 400. FIG. 6B illustrates the second transistor layer 300. FIG. 6C illustrates the first transistor layer 200.

As illustrated in FIG. 6A, the memory cell array layer 400 includes a memory cell array region MR and a capacitor region CR. As illustrated in FIG. 6A, the memory cell array region MR and the capacitor region CR are formed at different regions, not overlapping with one another, on the semiconductor substrate 100.

As illustrated in FIG. 6B, the second transistor layer 300 includes a region 310 and a region 320. The region 310 is positioned immediately below the memory cell array region MR. The region 320 is positioned immediately below the capacitor region CR. For example, the bit line selection circuit 2a, the word line selection circuit 3a, or a similar circuit can be formed in the region 310, which is positioned immediately below the memory cell array region MR. For example, a part of the constitution of the charge pump circuit 11 can be formed in the region 320, which is positioned immediately below the capacitor region CR. In the second transistor layer 300, the field-effect transistors positioned in other regions may be used to constitute other control circuits.

The first transistor layer 200, which is illustrated in FIG. 6C, is used to constitute the control circuits of the embodiment, such as a part of the constitution of the column control circuit 2, the row control circuit 3, the state machine 7, and the voltage generation circuit 10.

FIG. 7 is an enlarged view of a part of FIG. 6A. As illustrated in FIG. 7, in the memory cell array region MR, the bit line contacts BC are connected to the plurality of respective bit lines BL. Similarly, in the memory cell array region MR, the word line contacts WC are connected to the plurality of respective word lines WL. In FIG. 7, the bit line contacts BC are disposed in a straight line in the Y direction. However, the bit line contacts BC need not to be disposed in the straight line. Similarly, in FIG. 7, the word line contacts WC are disposed in the straight line in the X direction. However, the word line contacts WC also need not to be disposed in the straight line.

As illustrated in FIG. 5A and FIG. 7, with the embodiment, via holes CH extending in the laminating direction (the Z direction) are formed at the memory cell array region MR in the memory cell array layer 400 in the interlayer insulating layer 110. The bit line contacts BC and the word line contacts WC are embedded into the via holes CH. Therefore, the bit line contact BC and the word line contact WC are formed into a columnar shape. Here, the columnar shape is, for example, a cylindrical shape, a cylindroid shape, a quadrangular prism shape, or other polygonal column shapes. When referring to the columnar shape, it is assumed that the columnar shape includes, for example, a shape of narrowing from the upper to the lower, a shape of thickening from the upper to the lower, and a shape of the thickness cyclically changing. In the examples illustrated in FIG. 5A and FIG. 7, the bit line contact BC and the word line contact WC are formed into the cylindrical shape narrowing from the upper to the lower.

As illustrated in FIG. 7, the second conductive bodies 403 and 405 are disposed in a matrix in the capacitor region CR. In the example illustrated in FIG. 7, the plurality of second conductive bodies 403 at the odd-number-th position in the X direction are connected in common to the connecting wiring 404, thus constituting a first electrode 401. In the example illustrated in FIG. 7, the plurality of second conductive bodies 405 at the even-number-th position in the X direction are connected in common to the connecting wiring 406, thus constituting a second electrode 402. These first and second electrodes 401 and 402 constitute the one capacitor CP. In the example illustrated in FIG. 7, the connecting wirings 404 and 406 include a plurality of branch portions and a trunk portion. The branch portions extend in the Y direction and are disposed in the X direction. The trunk portion extends in the X direction and connects the plurality of branch portions in common. The branch portions and the trunk portion form a comb shape and are opposed to one another. However, the shapes of the connecting wirings 404 and 406 on the plane can be appropriately changed.

In the example illustrated in FIG. 7, the clock signal or the inverted clock signal is input to the first electrode 401. The second electrode 402 is connected to the node n between the field-effect transistors.

As illustrated in FIG. 5A and FIG. 7, via holes CaH extending in the laminating direction (the Z direction) are formed at the capacitor region CR in the memory cell array layer 400 in the interlayer insulating layer 110. The second conductive bodies 403 and 405 are embedded into the via holes CaH. Therefore, the second conductive bodies 403 and 405 are formed into a columnar shape similar to the bit line contact BC and the word line contact WC. Additionally, the second conductive bodies 403 and 405 are, similar to the bit line contact BC and the word line contact WC, formed into the cylindrical shape narrowing from the upper to the lower.

In the example illustrated in FIG. 5A and FIG. 7, widths (diameters) r of the bit line contact BC, the word line contact WC, and the second conductive bodies 403 and 405 are identical. In this embodiment, these widths (diameters) r of the constitutions increase or decrease with the identical ratio for the identical difference in height. In other words, the inclinations of the side surfaces of the second conductive bodies 403 and 405, the bit line contact BC, and the word line contact WC are all identical. Further, the embodiment forms the bit line contact BC, the word line contact WC, and the second conductive bodies 403 and 405 in the identical process. Accordingly, the bit line contact BC, the word line contact WC, and the second conductive bodies 403 and 405 are all made of the identical material.

As illustrated in FIG. 5A, with the embodiment, the lower ends of the second conductive bodies 403 and 405 are connected to the respective connecting wirings 404 and 406. The connecting wirings 404 and 406 are formed by, for example, using the wiring layers 307 disposed in the second transistor layer 300. Therefore, with the embodiment, the lengths of the second conductive bodies 403 and 405 in the laminating direction (the Z direction) are identical to the lengths of the bit line contact BC and the word line contact WC in the laminating direction. In the example illustrated in FIG. 5A, the upper ends of the second conductive bodies 403 and 405 are open ends.

A distance $W_A$ between the second conductive bodies 403 and 405 illustrated in FIG. 7 is adjusted by the operating voltage of the charge pump circuit 11 and the withstand voltage of the interlayer insulating layer 110. With the embodiment, the distance $W_A$ is, for example, approximately 10 nm to 200 nm. Since the electric potential is equal among the second conductive bodies 403 or 405, a distance $W_B$ between these second conductive bodies 403 or 405 can be set shorter than the distance $W_A$. With the embodiment, the distance $W_B$ is approximately 3 nm to 100 nm.

Next, with reference to FIG. 5A, the following describes a part of the manufacturing process of the semiconductor memory device according to the embodiment. To manufacture the semiconductor memory device according to the embodiment, for example, the wirings and the field-effect transistors in the first transistor layer 200 are formed on the semiconductor substrate 100. Next, the wirings and the field-effect transistors in the second transistor layer 300 are formed on the first transistor layer 200. Next, the bit lines BL, the word lines WL, and the memory cells MC in the memory cell array layer 400 are formed. Next, the interlayer insulating layer 110 embeds these constitutions. Next, in the interlayer insulating layer 110, the via holes CH and CaH are formed at parts positioned in the memory cell array region MR and the capacitor region CR, and the conductive bodies are embedded into the via holes CH and CaH. This forms the bit line contacts BC, the word line contacts WC, and the second conductive bodies 403 and 405.

Here, in the embodiment, the interlayer insulating layer 110 is made of the identical material in the memory cell array region MR and the capacitor region CR. Accordingly, to form the via holes CH and CaH in the interlayer insulating layer 110 by etching or a similar method, ratios of change in diameter to the depth of these via holes CH and CaH are equivalent. Accordingly, the inclinations of the side surfaces of the bit line contact BC, the word line contact WC, and the second conductive bodies 403 and 405, which are formed by being embedded here, are all approximately equivalent.

Note that, as described with reference to FIG. 5B, a part of the interlayer insulating layer 110' may also be made of a different material. For example, in the capacitor region CR of the memory cell array layer 400, the interlayer insulating layer 110' may be constituted of an insulating layer of high permittivity, such as $AlO_2$, $HfO_2$, $RuO_x$, $TaO_x$, and ZrO. This allows increasing the relative permittivity of the capacitors formed in the capacitor region CR. In this case, the interlayer insulating layer 110 is disposed at least between the memory cells MC. The interlayer insulating layer 110' is disposed at least between the second conductive bodies 403 and 405.

In the embodiment, the wirings connected to the lower ends of the bit line contact BC and the word line contact WC and the connecting wirings 404 and 406 connected to the lower ends of the second conductive bodies 403 and 405 are both positioned in the wiring layers 307. Therefore, it is only necessary that the via holes CH and CaH both extend from the top surface of the interlayer insulating layer 110 to the wiring layers 307. That is, the lengths of the bit line contact BC and the word line contact WC in the laminating direction approximately match. In this case, in view of anisotropy of etching or a similar property, the hole diameters of the via holes CH and CaH are possibly set to the identical size. This allows processing the interlayer insulating layer 110 in the memory cell array region MR and the capacitor region CR under the identical condition. Note that setting these hole diameters to different sizes is also possible.

With the embodiment, the bit line contact BC, the word line contact WC, and the second conductive bodies 403 and 405 are made of the identical material. Therefore, embedding the identical material to the via holes CH and CaH allows batch-forming the bit line contact BC, the word line contact WC, and the second conductive bodies 403 and 405. Note that embedding different materials to these via holes CH and CaH is also possible.

As illustrated in FIG. 5A and FIG. 6, the semiconductor memory device according to the embodiment includes the memory cell array 1 in the memory cell array region MR and the capacitors CP in the capacitor region CR, which is disposed on the semiconductor substrate 100 at a position different from the memory cell array region MR. The capacitor CP according to the embodiment constitutes the electrodes 401 and 402 with the second conductive bodies 403 and 405, which extend in the laminating direction (the Z direction). Therefore, the embodiment effectively utilizes the space extending in the laminating direction (the Z direction) in the capacitor region CR, which is disposed on the semiconductor substrate 100 at a position different from the memory cell array region MR. This comparatively decreases the area occupied by the capacitors CP on the semiconductor substrate 100, ensuring comparatively increasing the capacitance of the capacitors CP.

The semiconductor memory device according to the embodiment includes the bit line contacts BC (the first conductive bodies) and the word line contacts WC (the first conductive bodies), which extend in the laminating direction (the Z direction), in the memory cell array region MR. The semiconductor memory device includes the second conductive bodies 403 and 405, which similarly extend in the laminating direction (the Z direction), in the capacitor region CR. This allows batch-forming the second conductive bodies 403 and 405 in the capacitor region CR in the process of forming the bit line contacts BC and the word line contacts WC in the memory cell array region MR. That is, using the process of forming the memory cell array 1, the capacitors CP can be easily formed.

With the semiconductor memory device according to the embodiment, the plurality of second conductive bodies 403 and 405, which extend in the laminating direction, are connected in common with the connecting wirings 404 and 406, respectively. This forms the capacitor CP. This allows manufacturing the capacitor CP having a desired capacitance value.

Further, as illustrated in FIG. 5A, the embodiment constitutes the charge pump circuit 11 using the transistors and the wirings positioned in the second transistor layer 300. With the embodiment, the bit line contact BC, the word line contact WC, and the second conductive bodies 403 and 405 are made of the identical material. This allows manufacturing the charge pump circuit 11 in the process of manufacturing the semiconductor memory device without the addition of a process.

The embodiment constitutes the charge pump circuit 11 using the capacitors CP in the capacitor region CR. Accordingly, the embodiment comparatively decreases the area occupied by the capacitors CP on the semiconductor substrate 100, ensuring comparatively increasing capacitance of the capacitors CP. Therefore, for example, even if the power supply voltage is decreased, the voltage required for the writing operation, the erasure operation, or a similar operation of the memory cell array 1 can be generated at a requested speed. This allows achieving the low power consumption of the semiconductor memory device.

Further, when the charge pump circuit 11 can be formed at a smaller area, for example, among the first transistor layer 200 and the second transistor layer 300, an empty space is possibly formed at a part corresponding to immediately below the memory cell array region MR. For example, a sense amplifier circuit is added to such empty space to enhance parallelism of the data reading operation. This allows achieving the high-speed operation of the semiconductor memory device.

Second Embodiment

Figure 8:
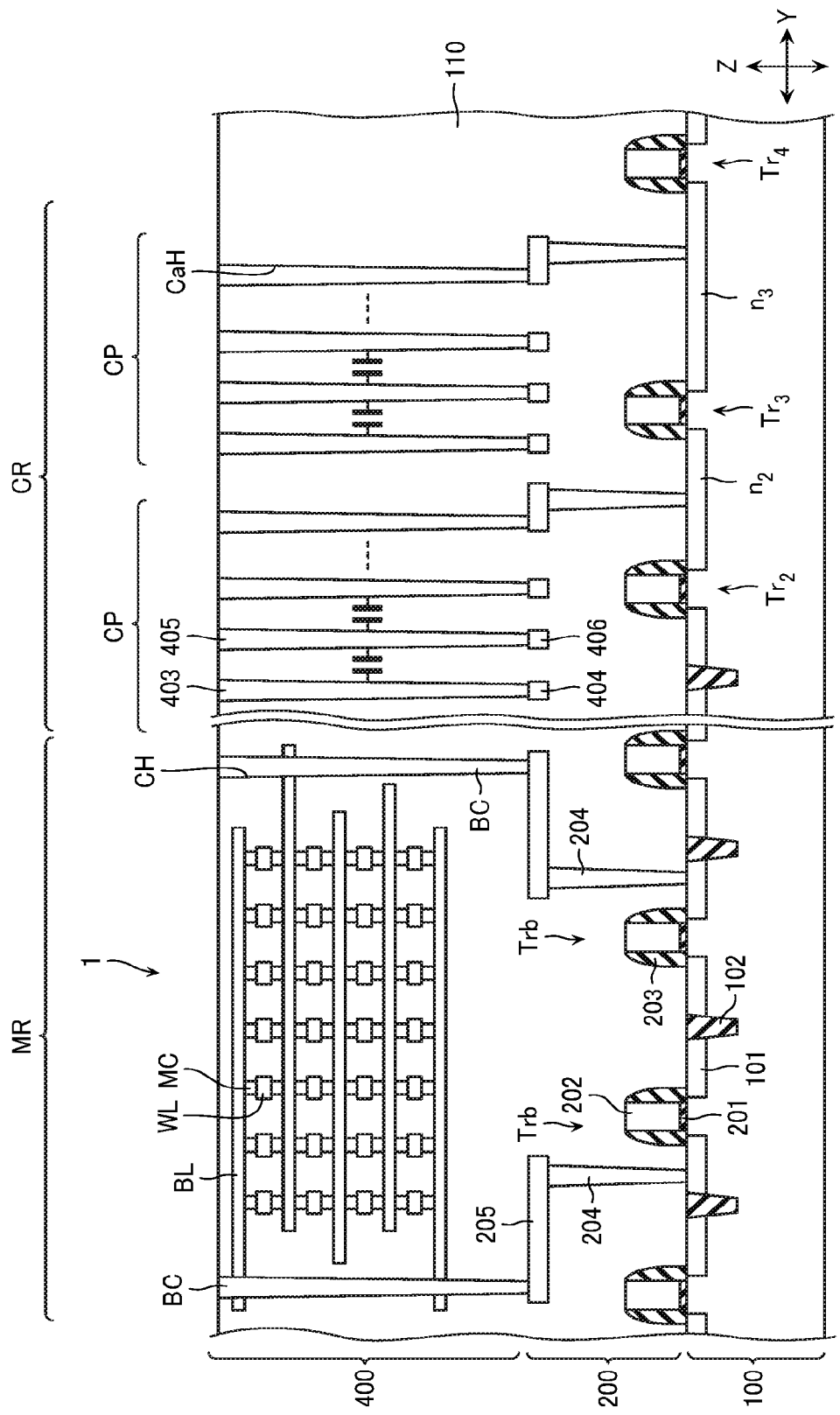
FIG. 8 is a schematic cross-sectional view illustrating an exemplary constitution of a semiconductor memory device according to a second embodiment.

The following describes the non-volatile semiconductor memory device according to the second embodiment with reference to FIG. 8. FIG. 8 is a schematic cross-sectional view illustrating an exemplary constitution of a non-volatile semiconductor memory device according to the embodiment. Like reference numerals designate corresponding or identical elements to those of the first embodiment, and therefore such elements will not be further elaborated here.

As illustrated in FIG. 8, the non-volatile semiconductor memory device according to the embodiment is formed by laminating the semiconductor substrate 100, the first transistor layer 200, and the memory cell array layer 400 in this order. That is, different from the first embodiment, the semiconductor memory device does not include the second transistor layer 300. Therefore, with the semiconductor memory device according to the embodiment, a count of manufacturing processes can be reduced compared with the semiconductor memory device the according to the first embodiment, ensuring manufacturing at low price. Otherwise, the non-volatile semiconductor memory device according to the embodiment is constituted similar to the non-volatile semiconductor memory device according to the first embodiment.

In the embodiment, the control circuits such as the column control circuit 2, the row control circuit 3, the state machine 7, and the voltage generation circuit 10 are mainly disposed in the first transistor layer 200.

Third Embodiment

Figure 9:
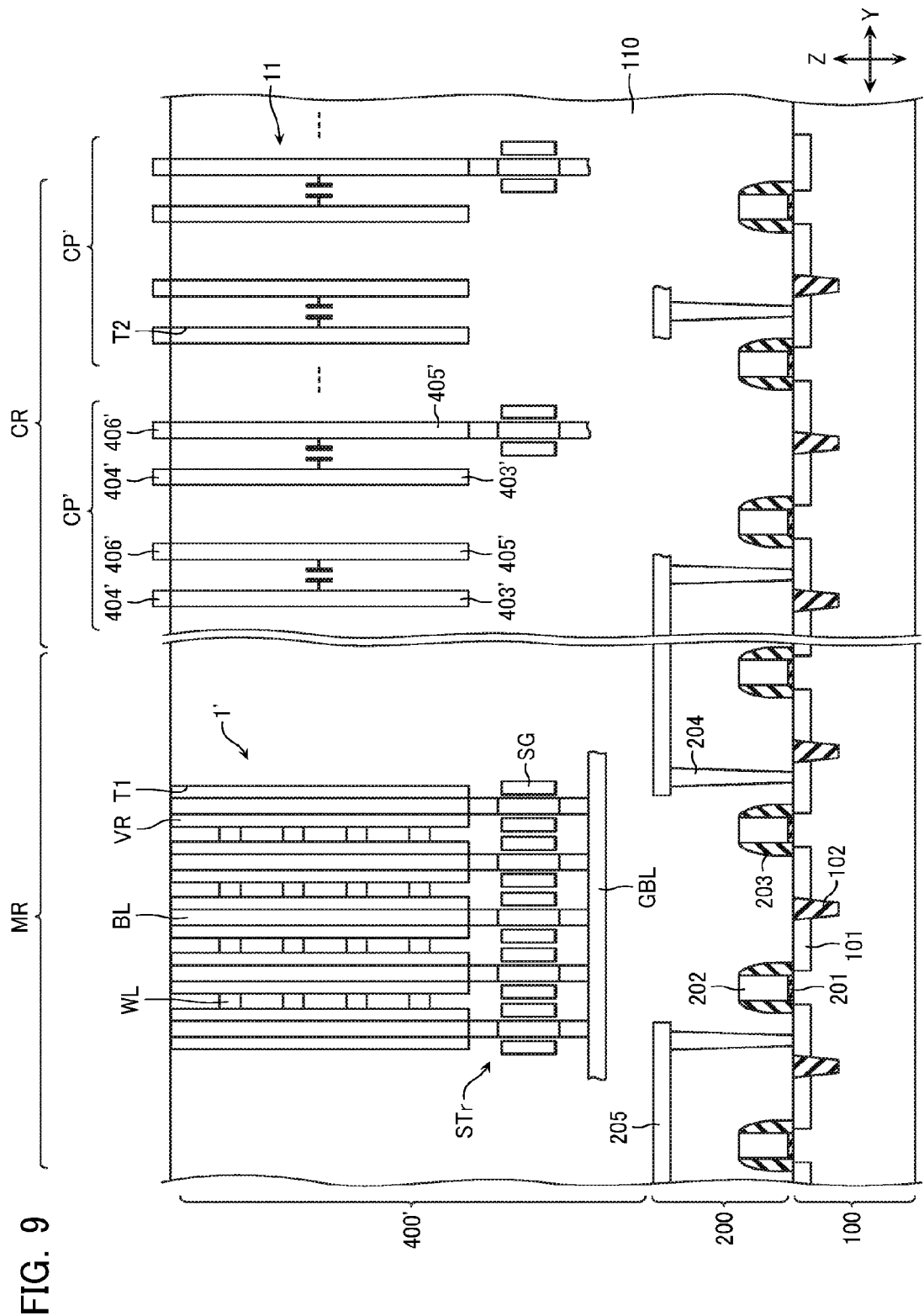
FIG. 9 is a schematic cross-sectional view illustrating an exemplary constitution of a semiconductor memory device according to a third embodiment.

The following describes the non-volatile semiconductor memory device according to the third embodiment with reference to FIG. 9 to FIG. 13. FIG. 9 is a schematic cross-sectional view illustrating an exemplary constitution of the non-volatile semiconductor memory device according to the embodiment. Like reference numerals designate corresponding or identical elements to those of the first embodiment, and therefore such elements will not be further elaborated here.

The first embodiment describes the example that forms the second conductive bodies 403 and 405 at the timing identical to the bit line contacts BC and the word line contacts WC. However, if another constitution extending in the laminating direction is present in the memory cell array, the second conductive bodies, which constitute the capacitor, can be batch-formed at the timing identical to this constitution (the first conductive body).

As illustrated in FIG. 9, the non-volatile semiconductor memory device according to the embodiment employs the following constitution. The memory cell array 1' includes the plurality of word lines WL (first wirings) and bit lines BL (second wirings). The word lines WL are laminated in the laminating direction (the Z direction) while the bit lines BL extend in the laminating direction (the Z direction). Second conductive bodies 403' and 405' are batch-formed at the timing identical to the bit lines BL. That is, the first conductive body of the embodiment is the bit line BL (the second wiring).

As illustrated in FIG. 9, the non-volatile semiconductor memory device according to the embodiment includes the semiconductor substrate 100 and the first transistor layer 200 similar to the non-volatile semiconductor memory device according to the second embodiment. The non-volatile semiconductor memory device according to the embodiment includes a memory cell array layer 400' on the first transistor layer 200 similar to the second embodiment.

Figure 10:
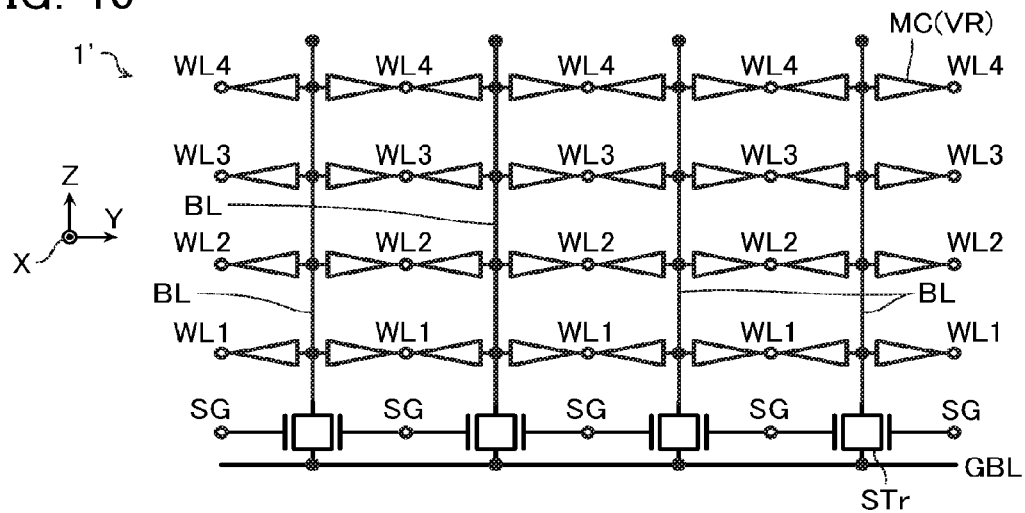
FIG. 10 is an exemplary circuit diagram of a memory cell array 1' of the semiconductor memory device.
Figure 11:
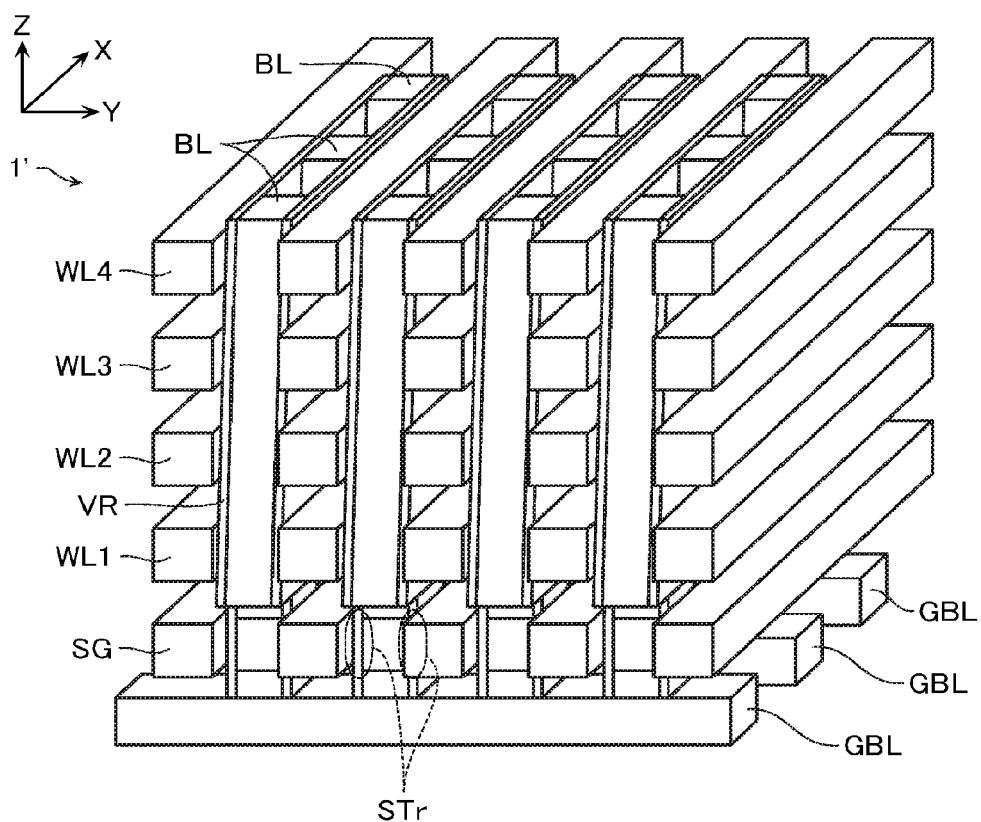
FIG. 11 is a schematic perspective view for describing the memory cell array 1'.

Next, with reference to FIG. 10 and FIG. 11, the following describes the memory cell array 1' according to the embodiment. FIG. 10 is an exemplary circuit diagram of the memory cell array 1'. FIG. 11 is a schematic perspective view of the memory cell array 1'. In FIG. 10 and FIG. 11, the X direction, the Y direction, and the Z direction are mutually orthogonal. The X direction is a direction perpendicular to the paper. The structures illustrated in FIG. 10 are continuously disposed in the X direction.

As illustrated in FIG. 10 and FIG. 11, the memory cell array 1' includes the word lines WL (WL1 to WL4), the bit lines BL, the memory cells MC, selection transistors STr, global bit lines GBL, and selection gate lines SG.

As illustrated in FIG. 10 and FIG. 11, the word lines WL1 to WL4 are disposed in the Z direction at predetermined pitches and extend in the X direction. The bit lines BL are disposed in a matrix in the X direction and the Y direction and extend in the Z direction. The memory cells MC are disposed at portions where these word lines WL and bit lines BL intersect. Accordingly, the memory cells MC are disposed in a three-dimensional matrix, the X, Y, and Z directions.

As illustrated in FIG. 10, the memory cell MC includes the variable resistive element VR. When the resistance value of the variable resistive element VR changes between a high resistance state and a low resistance state based on an applied voltage, the memory cell MC stores data in a non-volatile manner based on the resistance value. As illustrated in FIG. 11, with the embodiment, the plurality of variable resistive elements VR positioned on the identical X-Z plane are constituted of the identical variable resistance film.

As illustrated in FIG. 10 and FIG. 11, the selection transistor STr is disposed between the lower end of the bit line BL and the global bit line GBL. The global bit lines GBL are disposed at predetermined pitches in the X direction and extend in the Y direction. The one global bit line GBL is connected in common to the lower end of the plurality of selection transistors STr, which are disposed in a line in the Y direction.

The selection gate line SG disposed between the two selection transistors STr, which are adjacently disposed in the Y direction, can be connected in common to the two selection transistors STr. The selection gate lines SG are disposed at predetermined pitches in the Y direction and extend in the X direction. The one selection gate line SG is connected in common to the gates of the plurality of selection transistors STr, which are disposed in a line in the X direction. The gate electrode between the two selection transistors STr, which are adjacently disposed in the Y direction, can be separated. Thus, the two selection transistors STr each can be independently operated.

Figure 12:
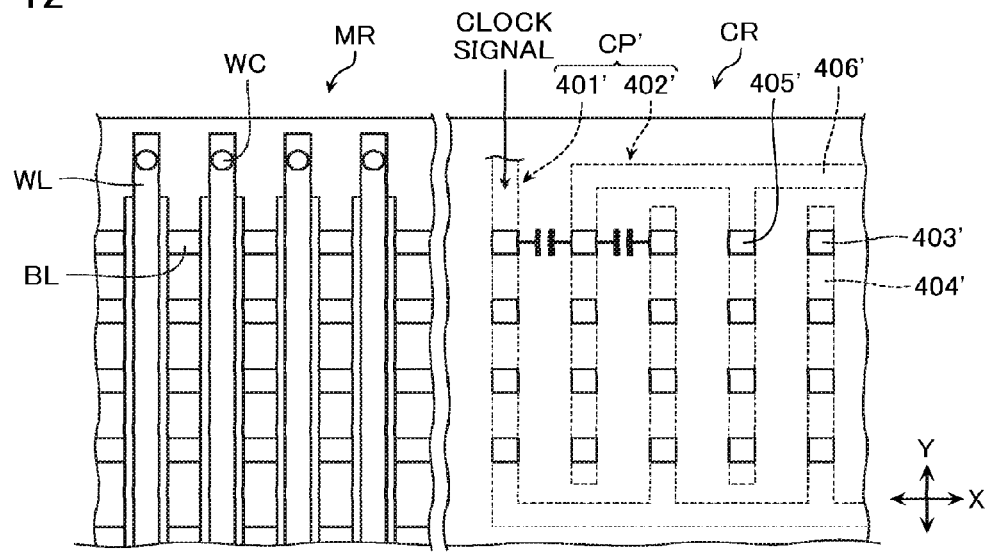
FIG. 12 is a schematic plan view of the semiconductor memory device.

The following describes the constitution of the memory cell array layer 400' according to the embodiment with reference to FIG. 12. FIG. 12 is a schematic plan view illustrating the constitution of the memory cell array layer 400'.

As illustrated in FIG. 12, in the memory cell array region MR, the plurality of bit lines BL are disposed in a matrix in the X direction and the Y direction. As illustrated in FIG. 9 and FIG. 12, with the embodiment, the bit lines BL are formed into the columnar shape (the quadrangular prism shape).

As illustrated in FIG. 12, in the memory cell array region MR, the word line contacts WC are each connected to the plurality of word lines WL. In FIG. 12, the word line contacts WC are disposed in the straight line in the X direction. However, the word line contacts WC also need not to be disposed in the straight line. The embodiment forms the word line contact WC into the columnar shape (the cylindrical shape).

As illustrated in FIG. 12, in the capacitor region CR of the embodiment, the second conductive bodies 403' and 405' are formed into the quadrangular prism shape similar to the bit line BL, different from the capacitor region CR according to the first embodiment. With the embodiment, the second conductive bodies 403' and 405' and the bit line BL are all made of the identical material.

As illustrated in FIG. 9 and FIG. 12, with the embodiment, the upper ends of the second conductive bodies 403' and 405' are connected to connecting wirings 404' and 406'. However, the connecting wirings 404' and 406' may be connected to the lower ends. In this case, the connecting wirings 404' and 406' can be formed using a wiring layer disposed at any of the layers, for example, the wiring layer identical to the global bit line GBL. For example, a field-effect transistor is formed at the layer identical to the selection transistor STr. Using this field-effect transistor, the charge pump circuit 11 can also be constituted. In this case, for example, it is also possible to use the second conductive body 405' positioned immediately above this field-effect transistor not as a part of the capacitor but as the node n.

Next, with reference to FIG. 9, the following describes apart of the manufacturing process of the semiconductor memory device according to the embodiment. To manufacture the semiconductor memory device according to the embodiment, for example, the wirings and the field-effect transistors in the first transistor layer 200 are formed on the semiconductor substrate 100. Next, the global bit lines GBL and the selection transistors STr in the memory cell array layer 400' are formed. Next, a plurality of conducting layers, which form the word lines WL, are laminated in the memory cell array region MR in the memory cell array layer 400' via the insulating layer. For example, the insulating layer is formed in the capacitor region CR. Next, grooves 1 are formed in the memory cell array region MR. The groove T1 extends in the X direction and separates the laminated conducting layer and insulating layer. Similarly, grooves T2 are formed in the insulating layer in the capacitor region CR. Subsequently, a film that will be the variable resistive element VR is formed in the groove T1. Next, a conducting layer forming the bit line BL and the second conductive bodies 403' and 405' is embedded into the grooves T1 and T2. Subsequently, this embedded conducting layer is separated in the X direction, forming the bit lines BL and the second conductive bodies 403' and 405'.

Here, with the embodiment, in the case where the insulating layer between the word lines WL and the insulating layer in the capacitor region CR are made of the identical material, a ratio of a change in the width to the depth of the part of the groove T1 corresponding to the insulating layer between the word lines WL is equivalent to the ratio of the change in the width to the depth of the groove T2. Therefore, the ratio of the change in the width to the depth of the part of the bit line BL, which is formed by being embedded here, opposed to the insulating layer between the word lines WL is equivalent to the ratio of the change in the width to the depth of the second conductive bodies 403' and 405'. However, even if the insulating layer between the word lines WL and the insulating layer in the capacitor region CR are made of the identical material, depending on the film forming method or a similar condition, the ratio may differ.

With the embodiment, the identical conducting layer is embedded in the grooves T1 and T2 and is separated in the X direction. This forms the bit lines BL and the second conductive bodies 403' and 405'. Therefore, the side surfaces of the bit line BL and the second conductive bodies 403' and 405' in the X direction separated in this process are possibly inclined to the equivalent extent.

Similar to the first embodiment, the semiconductor memory device according to the embodiment also effectively utilizes the space extending in the laminating direction (the Z direction) in the capacitor region CR, which is disposed on the semiconductor substrate 100 at a position different from the memory cell array region MR. This comparatively decreases the area occupied by capacitors CP' on the semiconductor substrate 100, ensuring comparatively increasing the capacitance of the capacitors CP'.

The semiconductor memory device according to the embodiment includes the bit lines BL, which extend in the laminating direction (the Z direction), in the memory cell array region MR. The semiconductor memory device includes the second conductive bodies 403' and 405', which similarly extend in the laminating direction (the Z direction), in the capacitor region CR. This allows batch-forming the second conductive bodies 403' and 405' in the capacitor region CR in the process of forming the bit lines BL in the memory cell array region MR. That is, using the process of forming the memory cell array 1', the capacitors CP' can be easily formed.

With the embodiment, the bit line BL and the second conductive bodies 403' and 405' are made of the identical material. Therefore, for example, the identical material is embedded into the memory cell array region MR and the capacitor region CR, and the memory cell array region MR and the capacitor region CR are processed at the identical timing. This allows batch-forming the bit lines BL and the second conductive bodies 403' and 405'.

Figure 13:
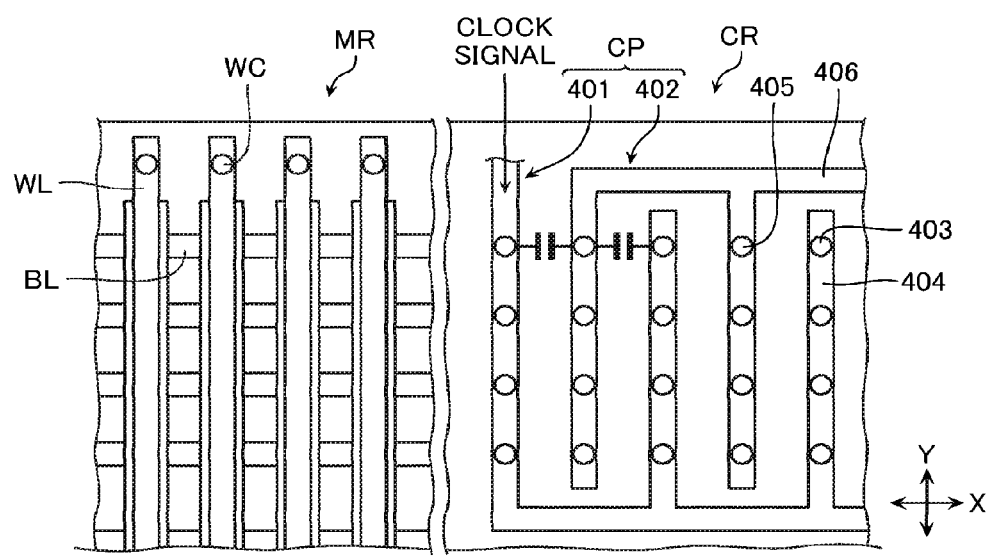
FIG. 13 is a schematic plan view illustrating another exemplary constitution of the semiconductor memory device.

The example illustrated in FIG. 12 describes the example that forms the second conductive bodies 403' and 405' at the timing identical to the bit lines BL. However, for example, as illustrated in FIG. 13, the second conductive bodies 403' and 405' can be formed at the timing identical to the word line contacts WC similar to the first embodiment. In this case, the constitution in the capacitor region CR is almost similar to the first embodiment.

For example, it is also possible to form the second conductive bodies 403' and 405' into a wall shape, not separating into the columnar shape (not separated in the X direction). For example, the following is also possible. A conducting layer corresponding to the word line WL is formed in the capacitor region CR in the memory cell array layer 400'. Insulating layers are disposed at the side surfaces of this conducting layer opposed to the second conductive bodies 403' and 405'. This also allows forming a capacitor where the conducting layer is designed as one electrode and the second conductive bodies 403' and 405' are designed as other electrodes.

Fourth Embodiment

Figure 14:
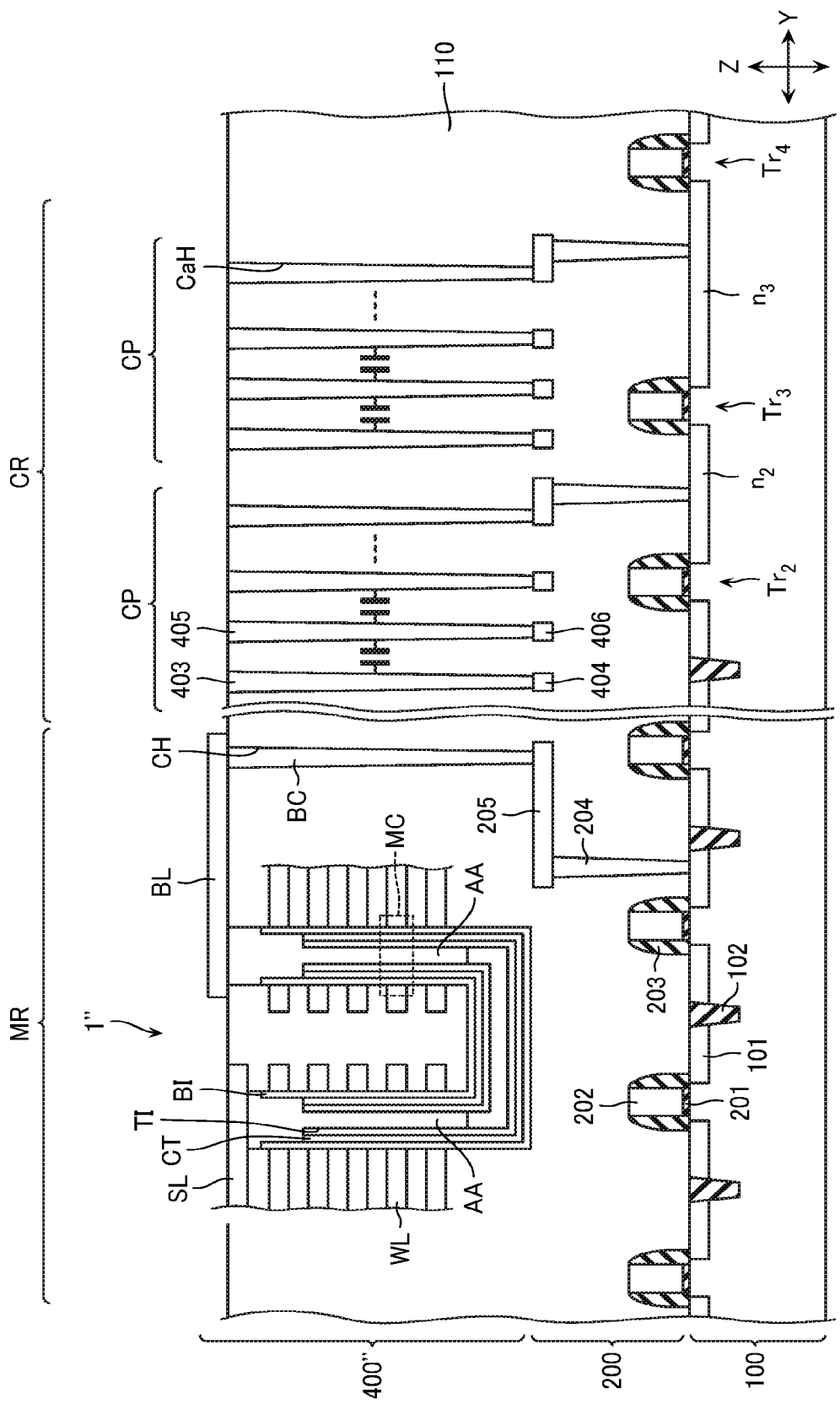
FIG. 14 is a schematic cross-sectional view illustrating an exemplary constitution of a semiconductor memory device according to a fourth embodiment.

The following describes the non-volatile semiconductor memory device according to the fourth embodiment with reference to FIG. 14. FIG. 14 is a schematic cross-sectional view illustrating an exemplary constitution of the non-volatile semiconductor memory device according to the embodiment. Like reference numerals designate corresponding or identical elements to those of the second embodiment, and therefore such elements will not be further elaborated here.

The first to third embodiments describe the constitution including the variable resistive element VR between the bit line BL and the word line WL as the memory cell array. However, as long as the constitution extending in the laminating direction is present in the memory cell array, the second conductive bodies, which constitute the capacitor, can be batch-formed at the timing identical to this constitution.

As illustrated in FIG. 14, the non-volatile semiconductor memory device according to the embodiment employs a three-dimensional flash memory. The three-dimensional flash memory laminates the plurality of memory cells MC in the laminating direction (the Z direction) as a memory cell array 1''. That is, the memory cell array 1'' according to the embodiment includes the plurality of word lines WL, a columnar-shaped semiconductor layers AA, a tunnel insulating layer TI, an electric charge accumulating layer CT, and a block insulating layer BI. The plurality of word lines WL are laminated in the laminating direction (the Z direction) via insulating layers. The semiconductor layers AA have their longitudinal directions in the laminating direction and are opposed to the plurality of laminated word lines WL. The tunnel insulating layer TI covers these semiconductor layers AA. The electric charge accumulating layer CT covers this tunnel insulating layer TI. The block insulating layer BI covers this electric charge accumulating layer CT and is in contact with the word lines WL.

As illustrated in FIG. 14, with the embodiment, the part where the one word line WL is opposed to the one semiconductor layer AA operates as the one memory cell MC. The memory cell MC records a threshold voltage as data. The threshold voltage of the memory cell MC is adjusted by an amount of electric charge accumulated in the electric charge accumulating layer CT of the memory cell MC. The amount of electric charge accumulated in the electric charge accumulating layer CT of the memory cell MC is adjusted by the writing operation and reading.

The semiconductor layer AA is made of, for example, polycrystalline silicon. The tunnel insulating layer TI and the block insulating layer BI are made of, for example, silicon oxide. The electric charge accumulating layer CT is made of, for example, silicon nitride. The word line WL is made of, for example, polysilicon and tungsten.

In the example illustrated in FIG. 14, the adjacent semiconductor layers AA are connected at the lower ends. One of the semiconductor layers AA is connected to the bit line BL at the upper end. The other semiconductor layer AA is connected to a source line SL at the upper end. As illustrated in FIG. 14, the bit line BL is connected to the wiring layer 205 of the first transistor layer 200 with the bit line contact BC extending in the laminating direction. This bit line contact BC can be formed similar to the bit line contact BC according to the first and second embodiments. Although not illustrated in FIG. 14, a source line contact, which connects the source line SL and the control circuit, can be formed almost similar to the bit line contact BC. In the example illustrated in FIG. 14, the adjacent semiconductor layers AA are connected at the lower ends. However, the semiconductor layers AA may be constituted to be independent of one another.

In the example illustrated in FIG. 14, similar to the first embodiment, the second conductive bodies 403 and 405 are formed at the timing identical to the bit line contact BC. However, for example, with the embodiment, the semiconductor layer AA also extends in the laminating direction. Therefore, in the process of forming the semiconductor layer AA or a similar member, the bit line contact BC can also be simultaneously formed.

Fifth Embodiment

Figure 15:
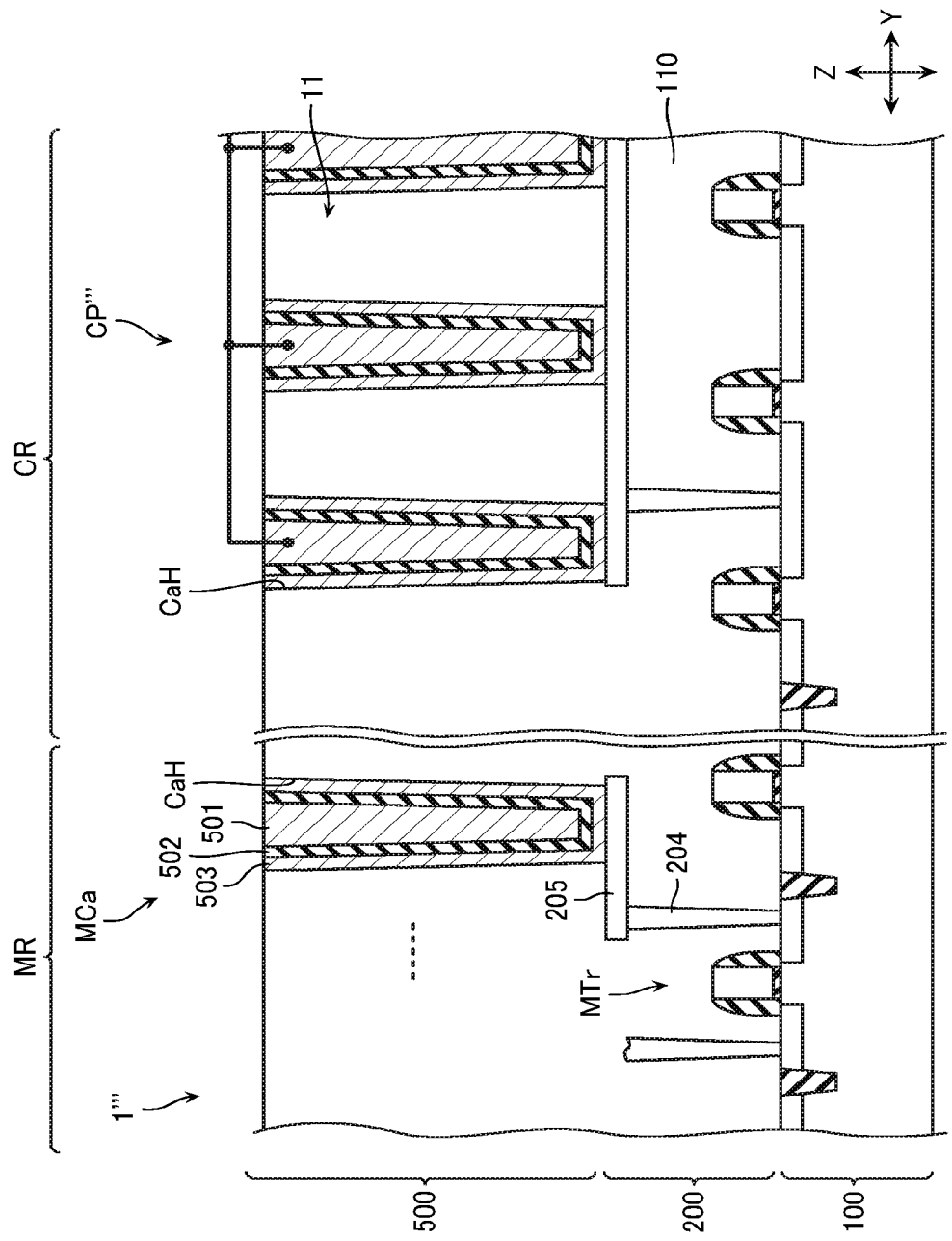
FIG. 15 is a schematic cross-sectional view illustrating an exemplary constitution of a semiconductor memory device according to a fifth embodiment.
Figure 16:
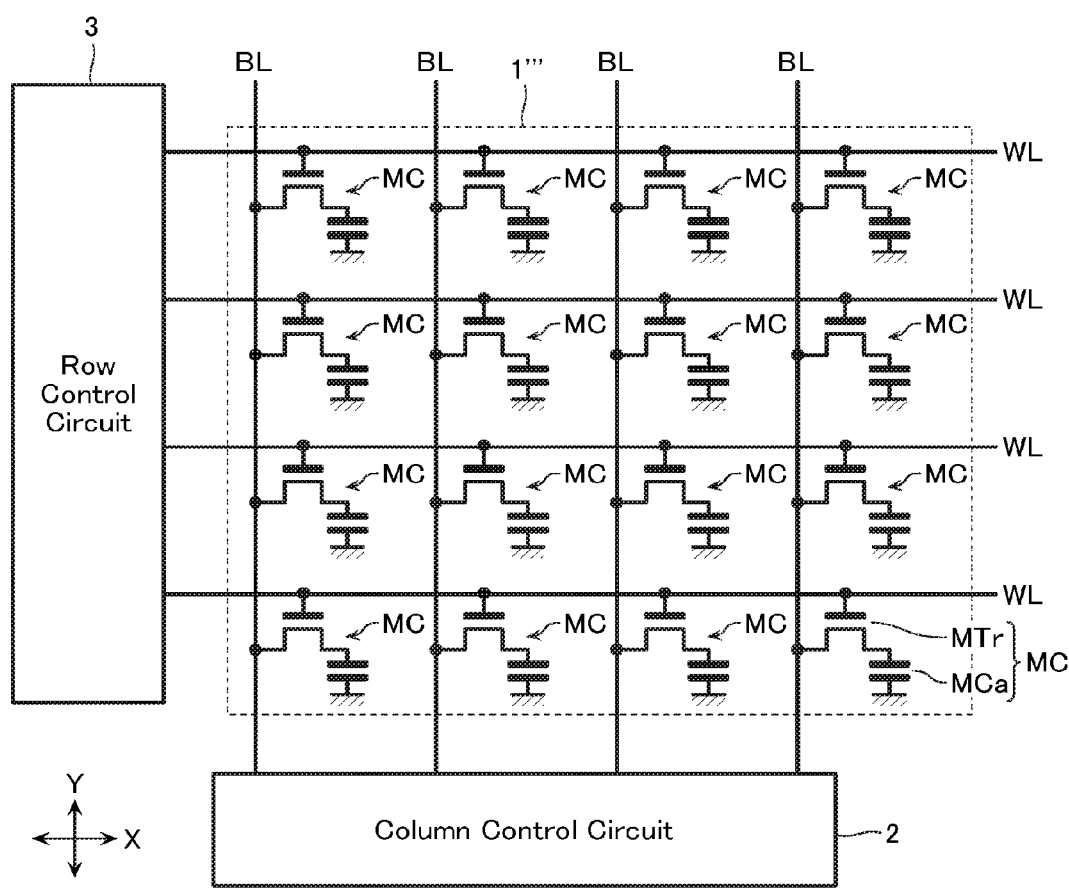
FIG. 16 is an exemplary circuit diagram of a memory cell array 1''' of the semiconductor memory device.

The following describes the semiconductor memory device according to the fifth embodiment with reference to FIG. 15 and FIG. 16. FIG. 15 is a schematic cross-sectional view illustrating an exemplary constitution of the semiconductor memory device according to the embodiment. FIG. 16 is a circuit diagram illustrating a constitution of a memory cell array 1''' according to the embodiment. Like reference numerals designate corresponding or identical elements to those of the second embodiment, and therefore such elements will not be further elaborated here.

As illustrated in FIG. 15 and FIG. 16, the embodiment employs a so-called Dynamic Random Access Memory (DRAM) as the memory cell array 1'''. With the embodiment, capacitors CP''' in the capacitor region CR are batch-formed at the timing identical to a memory capacitor MCa in the memory cell array region MR. In other words, electrodes (second conductive bodies) 501 and 503 constituting the capacitor CP''' are batch-formed simultaneously with the electrodes (the first conductive bodies) 501 and 503 constituting the memory capacitor MCa.

As illustrated in FIG. 16, the memory cell array 1''' according to the embodiment includes the plurality of bit lines BL and the plurality of word lines WL. The bit lines BL extend in the Y direction and are disposed in the X direction. The word lines WL extend in the X direction and are disposed in the Y direction. At the respective intersecting portions of these plurality of bit lines BL and word lines WL, the memory cells MC are formed. The memory cell MC includes memory transistors MTr and memory capacitors MCa. The memory capacitor MCa is connected in series between the bit line BL and the grounding terminal. The word line WL is connected to the gate terminal of the memory transistor MTr.

As illustrated in FIG. 15, with the embodiment, a capacitor layer 500 is formed on the semiconductor substrate 100 and the first transistor layer 200.

As illustrated in FIG. 15, in the first transistor layer 200, field-effect transistors positioned at the parts corresponding to the memory cell array region MR are used as the memory transistors MTr. The drain of the memory transistor MTr is connected to the bit line BL (not illustrated in FIG. 15) via the wiring 204. The source of the memory transistor MTr is connected to the memory capacitor MCa via the wiring 204 and the wiring layer 205.

As illustrated in FIG. 15, in the capacitor layer 500, the capacitor positioned at the part corresponding to the memory cell array region MR is used as the memory capacitor MCa. In the example illustrated in FIG. 15, the memory capacitor MCa includes the electrode 501, the insulating layer 502, and electrode 503. The electrode 501 is formed into a columnar shape. The insulating layer 502 covers the side surfaces and the bottom surface of this electrode 501. The electrode 503 is opposed to the side surfaces and the bottom surface of the electrode 501 via this insulating layer 502. The electrode 503 is connected to the wiring layer 205. The electrode 501 is connected to a grounding terminal (not illustrated in FIG. 15).

The electrodes 501 and 503 can be made of a metal such as tungsten and titanium nitride. The insulating layer 502 can also be constituted of the insulating layer with high permittivity, such as $Al_2O_3$, $HfO_2$, $RuO_x$, $TaO_x$, and ZrO. This allows increasing the relative permittivity of the respective capacitors.

As illustrated in FIG. 15, in the capacitor layer 500, the capacitors CP''' positioned at parts corresponding to the capacitor region CR are used as capacitors constituting the charge pump circuit 11 or a similar circuit. As illustrated in FIG. 15, the capacitor CP''' is constituted almost similar to the memory capacitor MCa. However, the electrodes 501 are connected in common to the upper ends of the plurality of neighboring capacitors CP'''. Similarly, in the neighboring plurality of capacitors CP''', the electrodes 503 are connected in common at the lower ends.

Next, with reference to FIG. 15, the following describes a part of the manufacturing process of the semiconductor memory device according to the embodiment. To manufacture the semiconductor memory device according to the embodiment, for example, the wirings and the field-effect transistors in the first transistor layer 200 are formed on the semiconductor substrate 100. Next, these constitutions are embedded with the interlayer insulating layer 110. Next, capacitor holes CaH are formed in the memory cell array region MR and the capacitor region CR on the interlayer insulating layer 110. Next, a conducting layer forming the electrode 503, an insulating layer forming the insulating layer 502, and a conducting layer forming the electrode 501 are laminated in the capacitor hole CaH in this order. This manufactures the semiconductor memory device according to the embodiment.

In the method for manufacturing the semiconductor memory device according to the embodiment as well, the capacitor CP''' can be manufactured using the manufacturing process of the memory cell array 1'''.

Sixth Embodiment

Figure 17:
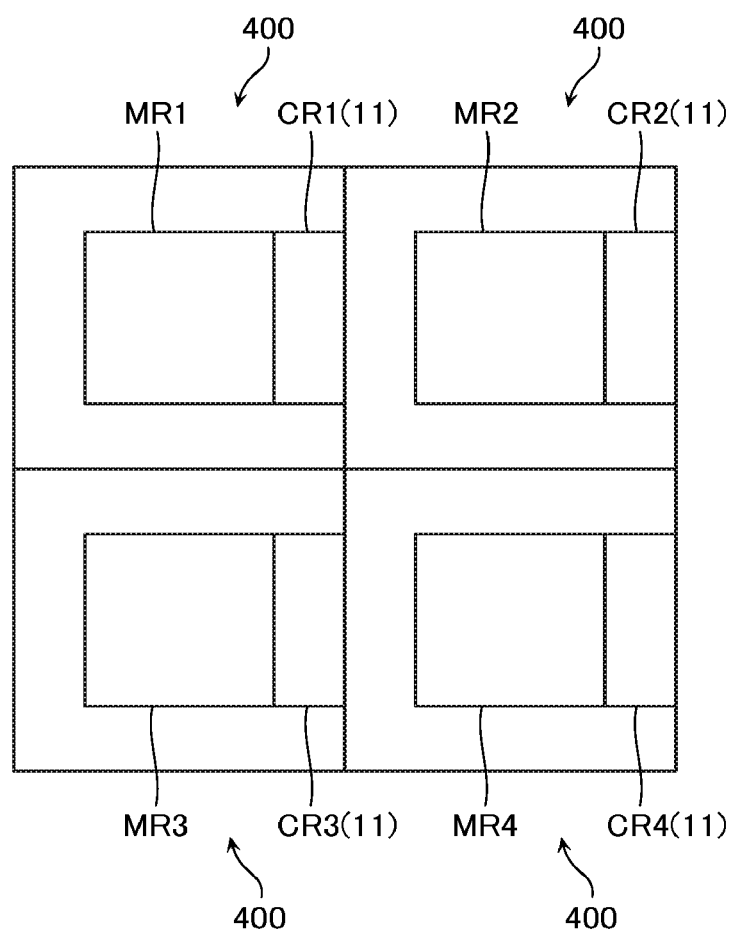
FIG. 17 is a schematic plan view illustrating an exemplary constitution of a semiconductor memory device according to a sixth embodiment.

The following describes the semiconductor memory device according to the sixth embodiment with reference to FIG. 17. FIG. 17 is a schematic plan view illustrating the constitution of the memory cell array layer 400 of the semiconductor memory device according to the embodiment. Like reference numerals designate corresponding or identical elements to those of the first embodiment, and therefore such elements will not be further elaborated here.

As illustrated in FIG. 17, with the semiconductor memory device according to the embodiment, the memory cell array layer 400 is divided into a plurality of subregions. The respective subregions include memory cell array regions MR1 to MR4 and capacitor regions CR1 to CR4. The capacitors formed in the capacitor regions CR1 to CR4 each constitute the charge pump circuits 11 different depending on each subregion. Further, these charge pump circuits 11 supply a voltage to the memory cell arrays in the respective adjacent memory cell array regions MR1 to MR4.

The semiconductor memory device according to the embodiment operates only the charge pump circuit 11 corresponding to the selected memory cell array, not operating the charge pump circuits 11 other than the one corresponding to the selected memory cell array. For example, in the case where only the memory cell array in the memory cell array region MR1 is selected, a voltage is supplied to the capacitors in the capacitor region CR1, which is adjacent to the memory cell array region MR1. Meanwhile, the voltage is not supplied to the capacitors in the capacitor regions CR2 to CR4, which are adjacent to the memory cell array regions MR2 to MR4, where the internal memory cell arrays are not selected. This allows minimizing power consumption in the charge pump circuit 11 adjacent to the memory cell array in a standby state, which is not selected, thus ensuring reducing power consumption.

Any of the memory cell arrays described in the first to fifth embodiments can also be disposed in the memory cell array region MR. The second transistor layer 300 described with reference to FIG. 5A may be disposed or may be omitted.

Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a semiconductor substrate;
a memory cell array disposed above the semiconductor substrate, the memory cell array including a plurality of memory cells;
a capacitor; and
a control circuit that supplies a voltage to the memory cell array, wherein
the memory cell array includes a first conductive body disposed in a first region above the semiconductor substrate, the first conductive body extending in a first direction intersecting with a surface of the substrate,
the capacitor includes first and second electrodes disposed in a second region different from the first region above the semiconductor substrate,
the first and second electrodes each comprise a second conductive body extending in the first direction,
the first conductive body and the second conductive body include an identical material,
the memory cell array further includes:
a plurality of first wirings extending in a second direction intersecting with the first direction;
a plurality of second wirings extending in a third direction intersecting with the second direction; and
a third wiring connected to the first wiring, the third wiring extending in the first direction,
the memory cell is disposed between the first wiring and the second wiring, and
the first conductive body comprises the third wiring.

2. The semiconductor memory device according to claim 1, wherein
the first conductive body and the second conductive body each have a columnar shape.

3. A semiconductor memory device, comprising:
a semiconductor substrate;
a memory cell array disposed above the semiconductor substrate, the memory cell array including a plurality of memory cells;
a capacitor; and
a control circuit that supplies a voltage to the memory cell array, wherein
the memory cell array includes a first conductive body disposed in a first region above the semiconductor substrate, the first conductive body extending in a first direction intersecting with a surface of the substrate,
the capacitor includes first and second electrodes disposed in a second region different from the first region above the semiconductor substrate,
the first and second electrodes each comprise a second conductive body extending in the first direction,
the first conductive body and the second conductive body include an identical material, wherein
the memory cell array further includes:
a plurality of first wirings laminated in the first direction; and
a second wiring that has a longitudinal direction in the first direction,
the memory cell is disposed between the first wiring and the second wiring, and
the first conductive body comprises the second wiring.

4. A semiconductor memory device, comprising:
a semiconductor substrate;
a memory cell array disposed above the semiconductor substrate, the memory cell array including a plurality of memory cells;
a capacitor; and
a control circuit that supplies a voltage to the memory cell array, wherein
the memory cell array includes a first conductive body disposed in a first region above the semiconductor substrate, the first conductive body extending in a first direction intersecting with a surface of the substrate,
the capacitor includes first and second electrodes disposed in a second region different from the first region above the semiconductor substrate,
the first and second electrodes each comprise a second conductive body extending in the first direction,
the first conductive body and the second conductive body include an identical material,
wherein
the memory cell array further includes:
a plurality of first wirings extending in a second direction intersecting with the first direction; and
a plurality of second wirings extending in a third direction intersecting with the first direction and the second direction, and
each memory cell includes:
a memory transistor including first and second terminals and a gate terminal, the first terminal being connected to the first wiring, the gate terminal being connected to the second wiring; and
another capacitor connected to the second terminal of the memory transistor, and
the first conductive body comprises the other capacitor.

5. A semiconductor memory device, comprising:
a semiconductor substrate;
a memory cell array disposed above the semiconductor substrate, the memory cell array including a plurality of memory cells;
a capacitor; and
a control circuit that supplies a voltage to the memory cell array, wherein
the memory cell array includes a first conductive body disposed in a first region above the semiconductor substrate, the first conductive body extending in a first direction intersecting with a surface of the substrate,
the capacitor includes first and second electrodes disposed in a second region different from the first region above the semiconductor substrate,
the first and second electrodes each comprise a second conductive body extending in the first direction,
the first conductive body and the second conductive body include an identical material, and wherein
the semiconductor memory device further includes a transistor layer that includes a plurality of transistors disposed between the semiconductor substrate and a layer including the capacitor, wherein
the transistors are connected in series, and
the second conductive bodies have one ends, each of the one ends being connected between the adjacent transistors.

6. The semiconductor memory device according to claim 1, wherein
the first regions and the second regions are plurally disposed above the semiconductor substrate,
the plurality of second regions are each disposed adjacent to the first regions, the control circuit supplies a voltage to the capacitor in the second region adjacent to the selected first region, and
the control circuit does not supply a voltage to the capacitor in the second region adjacent to the unselected first region.

7. A semiconductor memory device, comprising:
a semiconductor substrate;
a memory cell array disposed above the semiconductor substrate, the memory cell array including a plurality of memory cells;
a capacitor; and
a control circuit that supplies a voltage to the memory cell array, wherein
the memory cell array includes a first conductive body disposed in a first region above the semiconductor substrate, the first conductive body extending in a first direction intersecting with a surface of the substrate,
the capacitor includes first and second electrodes disposed in a second region different from the first region above the semiconductor substrate,
the first and second electrodes each comprise a second conductive body extending in the first direction,
the first conductive body and the second conductive body include an identical material, and
the semiconductor memory device further includes
a first insulating layer disposed between the adjacent memory cells; and
a second insulating layer disposed between the adjacent second conductive bodies, wherein
the second insulating layer has a permittivity higher than a permittivity of the first insulating layer.

8. The semiconductor memory device according to claim 3, wherein
the first regions and the second regions are plurally disposed above the semiconductor substrate,
the plurality of second regions are each disposed adjacent to the first regions,
the control circuit supplies a voltage to the capacitor in the second region adjacent to the selected first region, and
the control circuit does not supply a voltage to the capacitor in the second region adjacent to the unselected first region.

9. The semiconductor memory device according to claim 4, wherein
the first regions and the second regions are plurally disposed above the semiconductor substrate,
the plurality of second regions are each disposed adjacent to the first regions,
the control circuit supplies a voltage to the capacitor in the second region adjacent to the selected first region, and
the control circuit does not supply a voltage to the capacitor in the second region adjacent to the unselected first region.

10. The semiconductor memory device according to claim 5, wherein
the first regions and the second regions are plurally disposed above the semiconductor substrate, the plurality of second regions are each disposed adjacent to the first regions, the control circuit supplies a voltage to the capacitor in the second region adjacent to the selected first region, and the control circuit does not supply a voltage to the capacitor in the second region adjacent to the unselected first region.

11. The semiconductor memory device according to claim 7, wherein the first regions and the second regions are plurally disposed above the semiconductor substrate, the plurality of second regions are each disposed adjacent to the first regions, the control circuit supplies a voltage to the capacitor in the second region adjacent to the selected first region, and the control circuit does not supply a voltage to the capacitor in the second region adjacent to the unselected first region.

12. The semiconductor memory device according to claim 1, wherein the first and second electrodes each comprise a plurality of second conductive bodies and a connecting wiring, the second conductive bodies extending in the first direction, the connecting wiring connecting the plurality of second conductive bodies.

13. The semiconductor memory device according to claim 2, wherein the first and second electrodes each comprise a plurality of second conductive bodies and a connecting wiring, the second conductive bodies extending in the first direction, the connecting wiring connecting the plurality of second conductive bodies.

14. The semiconductor memory device according to claim 3, wherein the first and second electrodes each comprise a plurality of second conductive bodies and a connecting wiring, the second conductive bodies extending in the first direction, the connecting wiring connecting the plurality of second conductive bodies.

15. The semiconductor memory device according to claim 4, wherein the first and second electrodes each comprise a plurality of second conductive bodies and a connecting wiring, the second conductive bodies extending in the first direction, the connecting wiring connecting the plurality of second conductive bodies.

16. The semiconductor memory device according to claim 5, wherein the first and second electrodes each comprise a plurality of second conductive bodies and a connecting wiring, the second conductive bodies extending in the first direction, the connecting wiring connecting the plurality of second conductive bodies.

17. The semiconductor memory device according to claim 6, wherein the first and second electrodes each comprise a plurality of second conductive bodies and a connecting wiring, the second conductive bodies extending in the first direction, the connecting wiring connecting the plurality of second conductive bodies.

18. The semiconductor memory device according to claim 7, wherein the first and second electrodes each comprise a plurality of second conductive bodies and a connecting wiring, the second conductive bodies extending in the first direction, the connecting wiring connecting the plurality of second conductive bodies.

19. The semiconductor memory device according to claim 8, wherein the first and second electrodes each comprise a plurality of second conductive bodies and a connecting wiring, the second conductive bodies extending in the first direction, the connecting wiring connecting the plurality of second conductive bodies.

20. The semiconductor memory device according to claim 9, wherein the first and second electrodes each comprise a plurality of second conductive bodies and a connecting wiring, the second conductive bodies extending in the first direction, the connecting wiring connecting the plurality of second conductive bodies.

* * * * *